(12) United States Patent
Miyaba et al.

(10) Patent No.: US 6,281,665 B1
(45) Date of Patent: Aug. 28, 2001

(54) HIGH SPEED INTERNAL VOLTAGE GENERATOR WITH REDUCED CURRENT DRAW

(75) Inventors: Takeshi Miyaba, Yokohama; Tooru Tanzawa, Ebina; Masao Kuriyama, Fujisawa, all of (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/494,298

(22) Filed: Jan. 31, 2000

(30) Foreign Application Priority Data

Jan. 26, 2000 (JP) .................................................. 12-017480

(51) Int. Cl.[7] ...................................................... G03F 1/63
(52) U.S. Cl. ............................ 323/224; 323/271; 323/282
(58) Field of Search .................................. 323/223, 224, 323/268, 271, 282

(56) References Cited

U.S. PATENT DOCUMENTS

| 5,481,178 | * | 1/1996 | Wilcox et al. | 323/224 |
| 5,627,460 | * | 5/1997 | Bazinet et al. | 323/224 |
| 5,912,552 | * | 6/1999 | Tateishi | 323/224 |
| 5,966,003 | * | 10/1999 | Takimoto et al. | 323/224 |
| 6,188,209 | * | 2/2001 | Poon et al. | 323/282 |
| 6,204,651 | * | 3/2001 | Marcus et al. | 323/224 |

FOREIGN PATENT DOCUMENTS

| 10-011987 | 6/1996 | (JP) | G05F/3/24 |
| 11-122109 | 10/1997 | (JP) | H03M/1/74 |

\* cited by examiner

*Primary Examiner*—Jeffrey Sterrett
(74) *Attorney, Agent, or Firm*—Banner & Witcoff, LTD.

(57) ABSTRACT

A first and a second transistor are connected to an output node. A first and a second differential amplifier compare a reference voltage with the voltage supplied from a voltage setting circuit. When the voltage at the output node is raised, the differential amplifier drives the first transistor, thereby charging the output node. In addition, when the voltage at the output node is lowered, the second differential amplifier drives the second transistor, thereby discharging the charges at the output node. The voltage setting circuit connected to the output node is composed of a current-summing D/A converter. In the voltage setting circuit, the value of the load resistance is varied according to the voltage appearing at the output node.

23 Claims, 17 Drawing Sheets

HIGH SPEED INTERNAL VOLTAGE GENERATOR WITH REDUCED CURRENT DRAW

BACKGROUND OF THE INVENTION

This invention relates to an internal voltage generating circuit for generating voltages used in, for example, a semiconductor memory device, and more particularly to an internal voltage generating circuit for generating different voltages.

In a nonvolatile semiconductor memory, such as a flash EEPROM, several types of voltages differing in level are applied to a memory cell, depending on the operation, such as a read operation, a program (write) operation, or an erase operation.

FIG. 1 shows the relationship between a series of operations in a nonvolatile semiconductor memory and the voltages applied to the control gate of a memory cell in the respective operations. As shown in FIG. 1, in addition to a read operation, a program (write) operation, and an erase operation, a verify operation is performed after a program or erase operation to cause the threshold value of the memory cell to converge in a certain range in the nonvolatile semiconductor memory.

Furthermore, to sense the overerased state after the data in the selected block in a memory cell array has been erased all at once, an overerase verify operation is performed using an overerase verify voltage for sensing an overerased cell. When an overerased cell has been sensed in the overerase verify operation, the overerased cell is subjected to weak programming (or a weak write operation). The weak programming is a method of controlling the threshold distribution of the cell into a narrow range of 0.5 to 1.0V. In the method, writing is done by changing the voltage applied to the control gate of the cell little by little. Specifically, when an erased cell has been sensed in an overerase verify operation, the overerased cell is subjected to weak programming at a first gate voltage. Thereafter, the threshold value of the cell is verified again. If the threshold value of the cell has not shifted to the target range of threshold value distribution, the cell is subjected to weak programming again at a voltage higher than the first gate voltage by a voltage of ΔV. Repeating such an operation causes the threshold voltage of the cell to converge into the target range of threshold value distribution.

As described above, the nonvolatile semiconductor memory requires many voltages of different levels according to various types of operations.

In recent years, nonvolatile semiconductor memory devices have been designed to use a single power source. For this reason, the aforementioned various types of voltages used in a nonvolatile semiconductor memory are generated at a voltage generating circuit provided in a chip. The voltage generating circuit is composed of a booster circuit for boosting a supply voltage supplied from the outside and an internal voltage generating circuit for generating an internal voltage of a desired level from the output voltage of the booster circuit.

FIG. 2 shows an internal voltage generating circuit disclosed in Japanese Patent Application No. 8-162753 (Jpn. Pat. Appln. KOKAI Publication No. 10-011987). The internal voltage generating circuit, which is a voltage generating circuit of a so-called voltage-summing type, is capable of generating a voltage of a desired level according to the digital signal applied to a decoder. Specifically, in FIG. 2, a resistance string RS is composed of resistances R0 to R15 connected in series. The resistance string RS is connected via resistance Rstd to the ground. Switches S0 to S15 are connected to the junction nodes of an output node N1 and the respective resistances R0 to R15. The switches S0 to S15 are selectively turned on by the output signal of a decoder 17 to which digital signals A0, A1, A2, and A3 are supplied. Differential amplifiers 11 and 12 compare the voltage at node N2 to which the resistance string RS and resistance Rstd are connected with a reference voltage Vref. When the voltage at node N2 is lower than the reference voltage Vref, the differential amplifier 11 goes high at its output terminal. When the voltage at node N2 is higher than the reference voltage Vref, the differential amplifier 12 goes high at its output terminal.

The gate of an n-channel MOS transistor 13 is connected to the output of the differential amplifier 11 and is controlled by the output signal of the differential amplifier 11. A p-channel MOS transistor 14 is connected between a power supply terminal VPP and one end of the current path of the transistor 13 and supplies current to the transistor 13. A p-channel MOS transistor 15 connected between the power supply terminal VPP and the output node N1, together with the transistor 14, constitutes a current-mirror circuit. The transistor 15 pulls up the potential at the output node N1 according to the output signal of the differential amplifier 11. An n-channel MOS transistor 16 has its gate connected to the output terminal of the differential amplifier 12 and its current path connected between the output node N1 and the ground. When the output signal of the differential amplifier 12 is at the high level, the transistor 16 turns on, pulling down the potential at the output node N1. A booster circuit (not shown) supplies a voltage boosted from an external supply voltage to the power supply terminal VPP.

With this configuration, when the switch is changed according to a digital signal and the potential at node N2 is made lower than the reference voltage Vref, the output signal of the differential amplifier 11 goes to the high level and the output signal of the differential amplifier 12 goes to the low level. As a result, the transistor 13 turns on, the transistor 16 turns off, and the transistor 15 turns on. This causes the output node N1 to be charged via the transistor 15, raising the output voltage Vout. When the potential at the node N2 has become higher than the reference voltage Vref as a result of the rise of the output voltage Vout, the charging of the output node N1 is stopped.

In addition, when the switch is changed according to the digital signal and the potential at the node N2 is made higher than the reference voltage Vref, the output signal of the differential amplifier 11 goes to the low level and the output signal of the differential amplifier 12 goes to the high level. As a result, the transistor 13 turns off, the transistor 16 turns on, and the transistor 15 turns off. This causes the output node N1 to be discharged via the transistor 16, reducing the output voltage Vout. When the potential at the node N2 has become lower than the reference voltage Vref as a result of the drop of the output voltage Vout, the discharging of the output node N1 is stopped.

Although the internal voltage generating circuit can generate a required voltage, it has the following problem: as the number of output voltages increases, the number of resistances constituting the resistance string RS, the number of switches, and the number of decoders increase and therefore the area of the circuit increases. For example, when the number of output voltages is needed to be 32, 32 resistances are needed for the resistance string RS and 32 switches are required to switch these resistances. Furthermore, 32 5-bit decoders 17 for decoding a 5-bit digital signal are necessary to control the switches.

In general, when the number of output voltages is $2^N$, $2^N$ resistances are required and $2^N$ N-input decoders for decoding an N-bit digital signal are needed. As the value of N increases, the number of elements, including decoders and resistances, increases sharply and the area the pattern of those elements occupy in the chip increases, which makes the circuit design difficult. Moreover, the flexibility in changing the pattern decreases for variations in the value of resistance caused in the manufacture, which makes it difficult to change the design to adjust the value of resistance. Consequently, fine adjustment of the output voltage cannot be made.

To overcome the problem in the voltage-summing voltage generating circuit, a current-summing voltage generating circuit has been developed.

FIG. 3 shows a current-summing voltage generating circuit disclosed in Japanese Patent Application No. 9-277035 (Jpn. Pat. Appln. KOKAI Publication No. 11-122109). In FIG. 3, a ladder resistance circuit 21 is composed of resistances R (each having the value R) connected in series and resistances 2R (each having the value 2R) one end of each of which is connected to the corresponding junctions of the resistances R. A switch circuit 22 is connected to the ladder resistance circuit 21. The switch circuit 22 is composed of n-channel MOS transistors Q01, Q11, Q21, Q31, and Q41, and n-channel MOS transistors Q02, Q12, Q22, Q32, and Q42. Each of the n-channel MOS transistors Q01, Q11, Q21, Q31, and Q41 has one end of its current path connected to the other end of the corresponding resistance 2R and the other end of its current path connected to a first node X. Each of the n-channel MOS transistors Q02, Q12, Q22, Q32, and Q42 has one end of its current path connected to the other end of the corresponding resistance 2R and the other end of its current path connected to a first node Y. Digital signals (address signals) A0 to A4 are supplied to the gates of the transistors Q01 to Q41, respectively. Address signals /A0 to /A4 (the mark/represents an inverted signal) are supplied to the gates of the Q02 to Q42, respectively. A load resistance RD is connected between the junction node A and the ground.

A differential amplifier 23 compares a reference voltage Vref with the voltage at node X. The output terminal of the differential amplifier 23 is connected to the gate of a transistor Q61. A power source VPP is supplied to the source of the transistor Q61, whose drain is connected to an output node. The output node N1 is connected to the node x via a load resistance RL.

A current source circuit 24 is composed of a differential amplifier 25 and a transistor Q62 whose gate is connected to the output of the differential amplifier 25. The differential amplifier 25 compares the reference voltage Vref with the voltage at the first node Y. A supply voltage Vcc is supplied to the source of the transistor Q62, whose drain is connected to the first node Y.

The operation of the current-summing voltage generating circuit constructed as described above will be explained briefly. When the individual transistors Q01 to Q42 in the switch circuit 22 are changed according to the address signals A0 to /A4, the resistance value of the latter resistance circuit 21 connected to the load resistance RL changes. As a result, the current flowing through the load resistance RL changes. In response to this, the differential amplifier 23 and transistor Q61 are operated, which performs control so that the potential at the first node x may become equal to the reference voltage Vref. In the current source circuit 24, the differential amplifier 25 and transistor Q62 control the potential at the second node Y so that it may become equal to the reference voltage Vref. As a result, when the switch circuit 22 is switched according to the address signals A0 to A4, /A0 to /A4, the potentials at the first node X and second node Y are controlled so that they may be constantly equal to the reference voltage Vref. If this condition is satisfied, the combined resistance can be calculated as described below.

It is assumed that, of the nodes in the ladder resistance circuit 21, current I3 flows from, for example, node E. At this time, the combined resistance obtained when the node Y side is viewed from node E is R+R=2R, which is equal to the resistance value obtained when the resistance 2R side is viewed from node E. Thus, the current I4 flowing from the node F side to the node E side is equal to the current I4' flowing through the transistor Q41 and resistance 2R into node E or the current I4' flowing from the second node Y through the transistor Q42 and resistance 2R to node E when the transistor Q42 is on. Specifically, the relationship between those currents is expressed by equation (1):

$$I_4'=I_4=I_3/2 \qquad (1)$$

Next, consider a node D in the ladder resistance circuit 21. The combined resistance from the node D to node E side is 2R as expressed by equation (2):

$$R+\cfrac{1}{\cfrac{1}{2R}+\cfrac{1}{R+R}}=2R \qquad (2)$$

Therefore, the value of the combined resistance at node D on the node E side is equal to the value of the resistance on the resistance 2R side. Consequently, the current I3 flowing from the node E side to the node D side is equal to the current I3' flowing from the first node x through the transistor Q31 and resistance 2R into node D when the transistor Q31 is on or to the current I3' flowing from the second node Y through the transistor Q32 and resistance 2R into node D when the transistor Q32 is on. Specifically, if the current I2 flows into node D, the relationship between those currents is expressed by equation (3):

$$I_3'=I_3=I_2/2 \qquad (3)$$

As described above, the combined resistance at each node in the ladder resistance circuit 21 is considered in sequence. Finally, the value of the combined resistance from the node A to node F side is represented by a continued fraction expressed as equation (4) and equals the value of the resistance on the resistance 2R side:

$$R+\cfrac{1}{\cfrac{1}{2R}+\cfrac{1}{R+\cfrac{1}{\cfrac{1}{2R}+\cdots\cfrac{1}{R+\cfrac{1}{\cfrac{1}{2R}+\cfrac{1}{R+R}}}}}}=2R \qquad (4)$$

Therefore, at each node, the current flowing toward the ground potential side is what is obtained by adding the same current flowing from each of the node F side and resistance 2R side.

Specifically, if the current flowing to the load resistance RD is Iall, the currents flowing through the individual resistances R from node A toward the node F side are expressed as Iall/2, Iall/4, Iall/8, . . . , Iall/32 in this order. These currents are added and the resulting current is converted by the ladder resistance circuit 21 into a voltage. Thus, the output voltage Vout outputted at the output node N1 is expressed by equation (5):

$$V_{OUT} = \left[1 + \frac{R_L}{R + R_D} \sum_{i=0}^{4} 2^{-i-1} A_i\right] V_{REF} \quad (5)$$

where Ai is the address signals A0 to A4 and calculations are done, provided that when Ai is at the high level, it has a "1" and when Ai is at the low level, it has a "0".

In the current-summing voltage generating circuit constructed as described above, the switch circuit 22 connected to the ladder resistance circuit 21 is controlled directly by the address signals. As a result, many decoders are not needed and therefore the pattern area is reduced. Since two types of resistances, R and 2R, are used in the ladder resistance circuit 21, the circuit is designed easily. Consequently, the voltage generating circuit is more effective as the number of bits in the digital signals increases.

In the conventional current-summing voltage generating circuit, however, the output voltage Vout is changed by changing the value of the current flowing through load resistance RL, as seen from equation (5). As a result, as the current flowing through the load resistance is increased, the output voltage rises.

FIG. 4 shows the relationship between the current flowing through the load resistance RL and the output voltage Vout. In a case where setting is done so that the maximum current Imax may flow through the load resistance RD in the effective range when the output voltage Vout is the highest, the current flowing through the load resistance RL is smaller than the minimum current Imin in the effective range when the output voltage Vout is the lowest, as shown by characteristic P1. Thus, it takes a long time to charge and discharge the output node via the load resistance RL, lowering the response performance. As described earlier, for example, when weak programming is effected, it is necessary to set the potential of the word line quickly to a desired potential. When the response performance is low as described above, it is difficult to secure the desired operating speed.

On the other hand, in a case where setting is done so that the minimum current Imin may flow through the load resistance RL in the effective range when the output voltage Vout is the lowest, the current flowing through the load resistance RL is larger than the maximum current Imax in the effective range when the output voltage Vout is the highest, as shown by characteristic P2. Thus, the drawn current becomes large, making it difficult to use the circuit in, for example, a battery-driven portable device.

In addition, the booster circuit for supplying the supply voltage VPP to the supply voltage generating circuit is composed of a so-called charge pump circuit. The charge pump circuit is composed of, for example, transistors diode-connected, and capacitors one end of each of which is connected to the corresponding junction of the transistors and to the other end of which a signal from an oscillator is supplied. As the charge pump circuit generates a higher voltage, its current supplying capability decreases. Thus, the setting as shown by characteristic P2 has a significant effect on the design of the booster circuit.

BRIEF SUMMARY OF THE INVENTION

It is, accordingly, an object of the present invention to overcome the above problem by providing an internal voltage generating circuit capable of not only generating a desired voltage at high speed but also reducing the drawn current.

The forgoing object is accomplished by providing a voltage generating circuit comprising: an output node for outputting at least two types of output potentials; a voltage divider circuit which is connected to the output node, divides the output potential at the output node, and outputs the divided voltage; a first differential amplifier to which a reference voltage and the divided voltage outputted from the voltage divider circuit are supplied and which outputs a first output signal according to the potential difference between the divided voltage and the reference voltage; a second differential amplifier to which the reference voltage and the divided voltage outputted from the voltage divider circuit are supplied and which outputs a second output signal according to the potential difference between the divided voltage and the reference voltage; a charging circuit which is connected between a first power source and the output node and which charges the output node according to the output signal of the first differential amplifier; and a discharging circuit which is connected between a second power source and the output node and which discharges the output node according to the output signal of the second differential amplifier, wherein the voltage divider circuit includes a first resistance circuit one end of which is connected to the output node and whose resistance value is varied according to a first control signal, and a second resistance circuit which is connected to the other end of the first resistance circuit and which changes the value of the current flowing through the first resistance circuit according to a second control signal.

With the present invention, when a voltage is generated at the output node, the first and second resistance circuits are controlled by the first and second control signals. The resistance value flowing through the first resistance circuit is varied according to the range of the voltage outputted at the output node. As a result, not only a specific voltage can be generated at high speed, but also the drawn current can be reduced.

Furthermore, with the invention, the reference voltage and a first divided voltage are supplied to the first differential amplifier and the reference voltage and a second divided voltage are supplied to the second differential amplifier. The first differential amplifier compares the first divided voltage with the reference voltage and controls the charging circuit according to the result of the comparison. The second differential amplifier compares the second divided voltage with the reference voltage and controls the discharging circuit according to the result of the comparison. In the steady state, the output signals of the first and second differential amplifiers are low. As a result, in the steady state, the charging and discharging circuits are turned off reliably, reducing the drawn current.

In addition, with the invention, a first reference voltage and the divided voltage are supplied to the first differential amplifier and a second reference voltage and the second divided voltage are supplied to the second differential amplifier. The first differential amplifier compares the divided voltage with the first reference voltage and controls the charging circuit according to the result of the comparison. The second differential amplifier compares the divided voltage with the second reference voltage and controls the discharging circuit according to the result of the comparison. In the steady state, the output signals of the first and second differential amplifiers are low. As a result, in the steady state, the charging and discharging circuits are turned off reliably, reducing the drawn current.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinafter, referring to the accompanying drawings, embodiments of the present invention will be explained.

Figure 1:
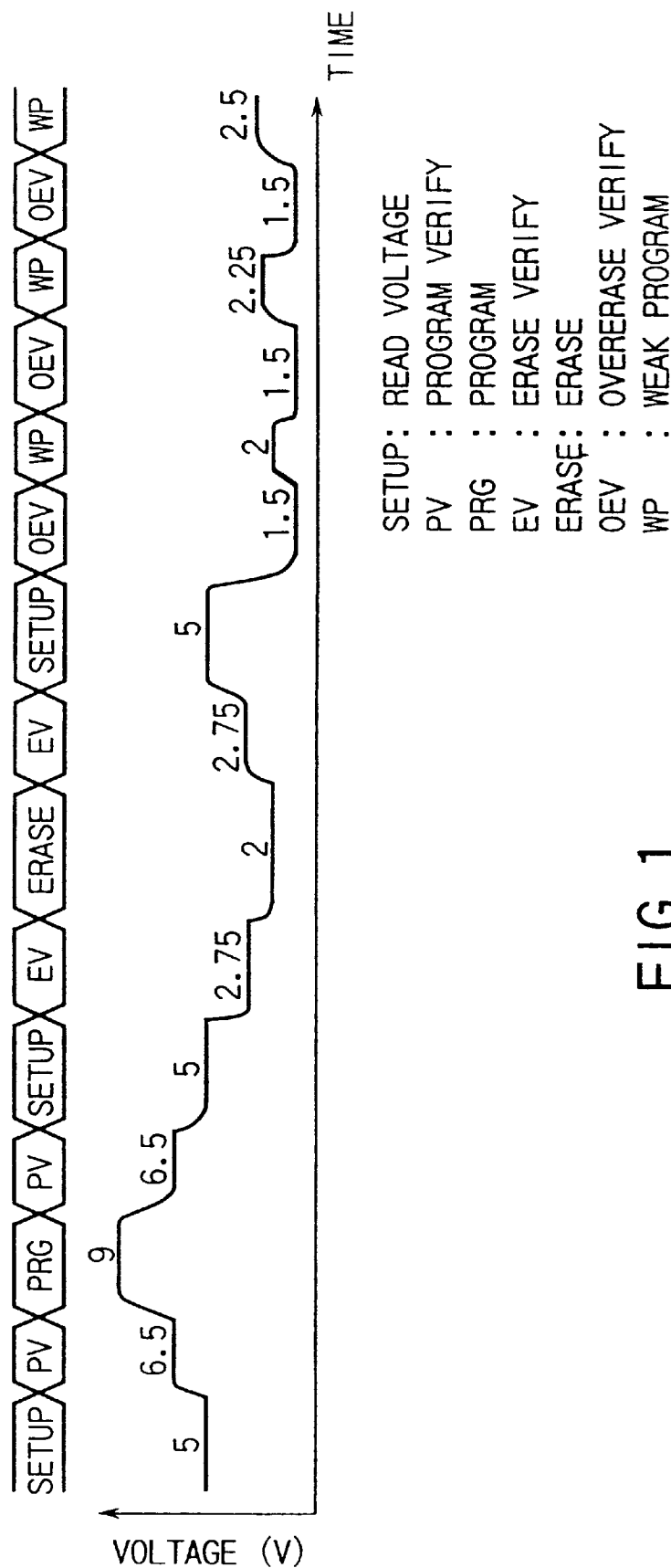
FIG. 1 shows an example of the relationship between a series of operations of a nonvolatile semiconductor memory and voltages.
Figure 2:
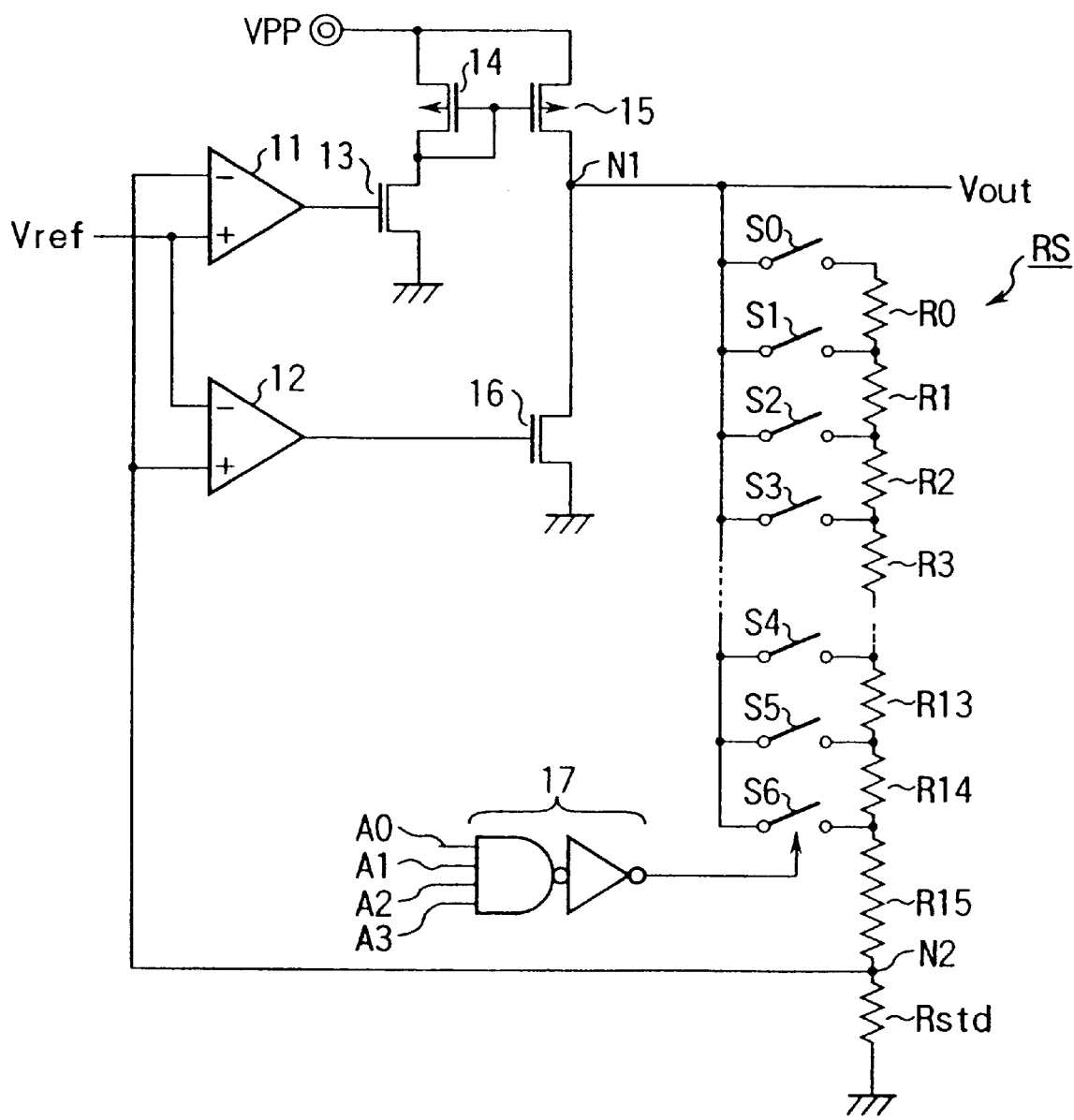
FIG. 2 is a circuit diagram of a conventional internal voltage generating circuit.
Figure 3:
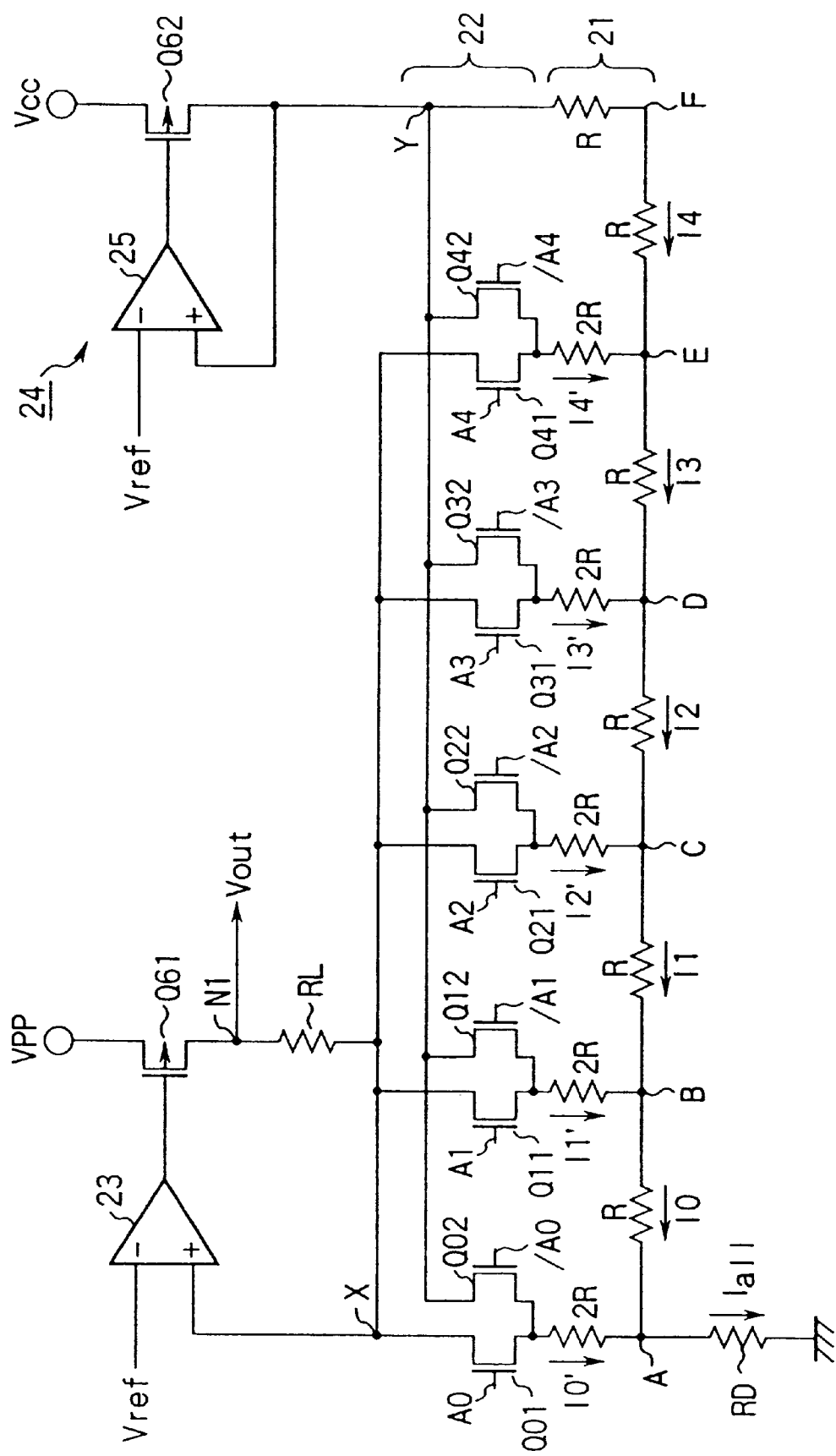
FIG. 3 is a circuit diagram of another conventional internal voltage generating circuit.
Figure 4:
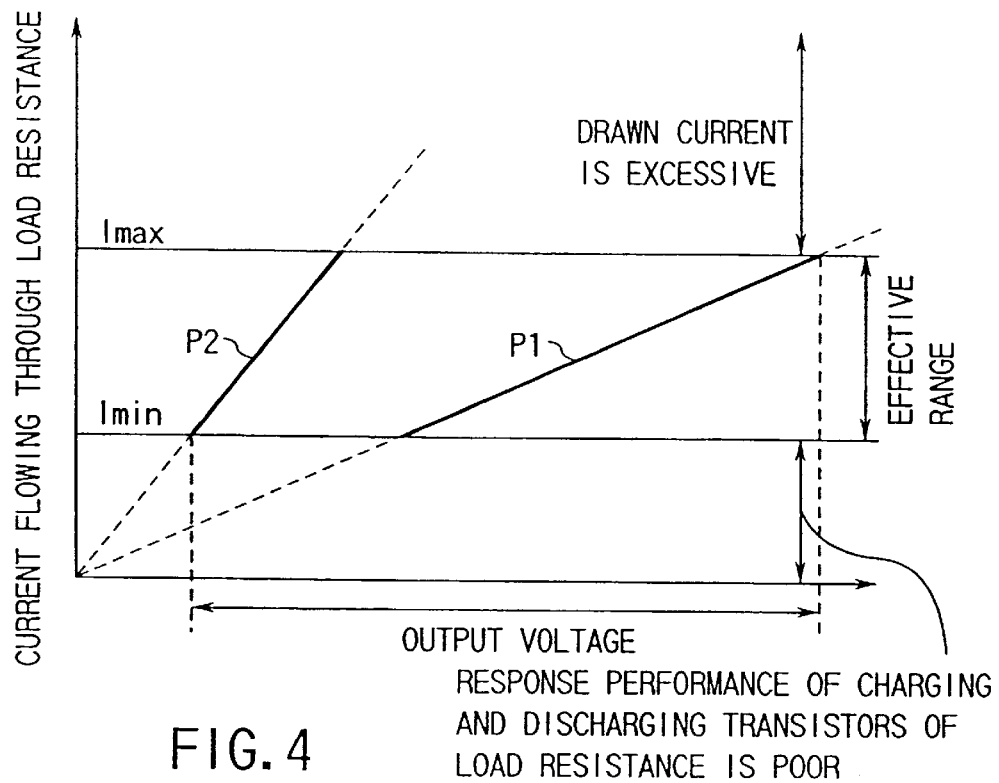
FIG. 4 shows the operating characteristic of FIG. 3.
Figure 5:
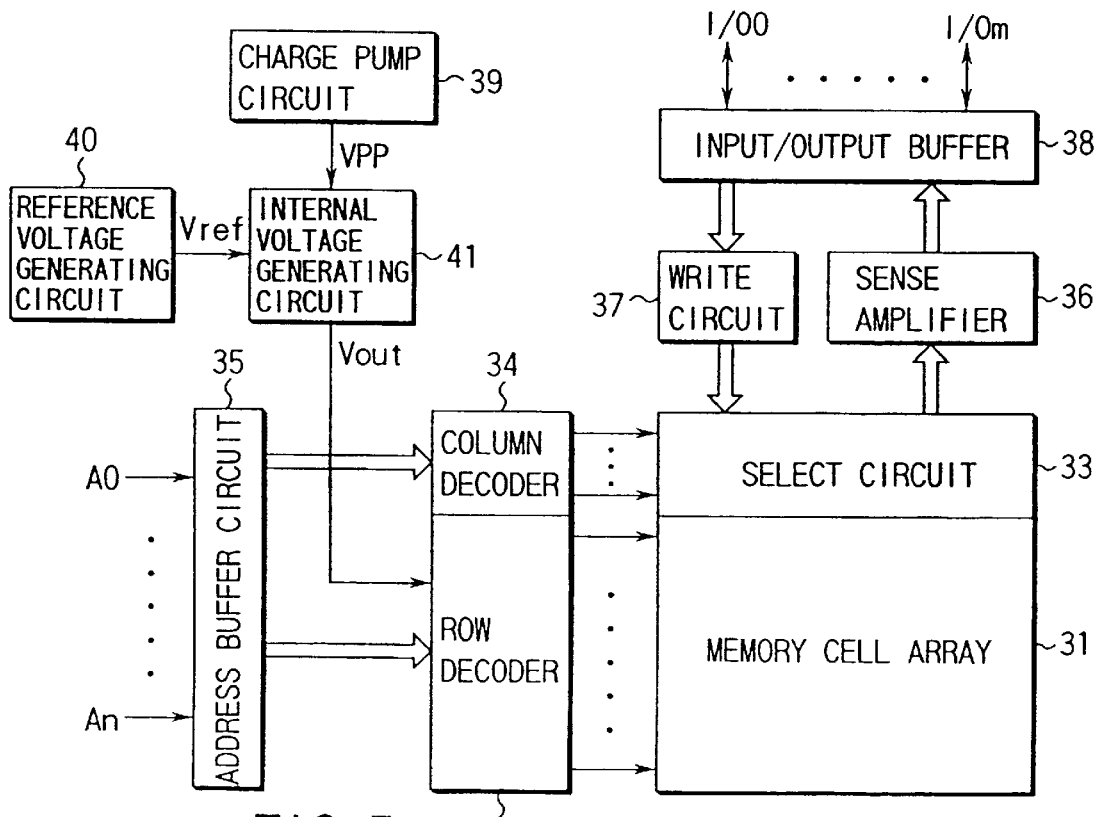
FIG. 5 is a block diagram of a nonvolatile semiconductor memory to which the present invention is applied.

FIG. 5 shows an overall configuration of, for example, a nonvolatile semiconductor memory to which the present invention is applied. A memory cell array 31 is composed of, for example, NOR flash EEPROMs. A row decoder 32 and a select circuit 33 are connected to the memory cell array 31. A column decoder 34 is connected to the select circuit 33. An address buffer circuit 35 is connected to the row decoder 32 and column decoder 34. Internal address signals (or external address signals) A0 to An are supplied to the row decoder 32 and column decoder 34 by way of an address buffer circuit 35. The row decoder 32 selects a word line in the memory cell array 31 according to the internal address signal. The column decoder 34 selects a bit line in the memory cell array 31 according to the internal address signal.

A sense amplifier 36 and a write circuit 37 are connected to the select circuit 33. An input/output buffer 38 is connected to the sense amplifier 36 and write circuit 37. When the data is read, the sense amplifier 36 senses the data read from the selected memory cell in the memory cell array 31 and supplies the data to the input/output buffer 38. When the data is written, the write circuit 37 supplies the data supplied from the input/output buffer 38 to the selected memory cell in the memory cell array 31.

The charge pump circuit 39 raises, for example, an external supply voltage Vcc to produce a boosted voltage VPP. A reference voltage generating circuit 40 generates a reference voltage Vref from, for example, the external supply voltage Vcc. An internal voltage generating circuit 41 is connected to the charge pump circuit 39 and reference voltage generating circuit 40. In a read operation, a programming operation, an erase operation, various verify operations, or a weak programming operation, the internal voltage generating circuit 41 generates an output voltage Vout of a specific level from the boosted voltage VPP on the basis of the reference voltage Vref.

In the erase mode, a negative voltage is supplied to the word lines. The negative voltage is generated by a word-line voltage generating circuit (not shown) (for example, a negative charge pump circuit).

Figure 6:
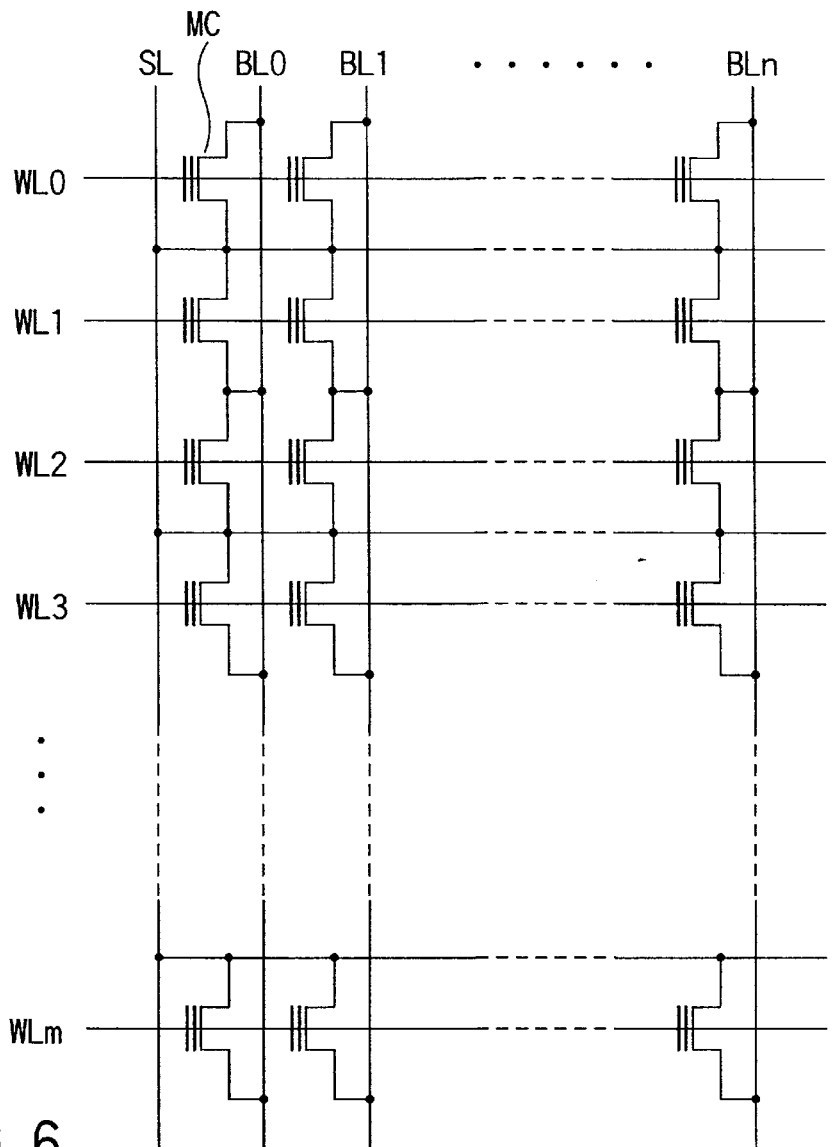
FIG. 6 is a circuit diagram showing an example of the memory cell array shown in FIG. 5.

FIG. 6 shows an example of the memory cell array 31. The memory cell array 31 is composed of, for example, NOR EEPROMs. Memory cells MC are arranged in rows and columns in matrix form. The control gates of the memory cells MC arranged in each row are connected to word lines WL0, WL1, WL2, WL3, . . . , WLm, respectively. The drains of the memory cells MC connected to the corresponding columns are connected to bit lines BL0, BL1, . . . , BLn, respectively. The sources of the memory cells MC are connected to a source line SL.

Figure 7:
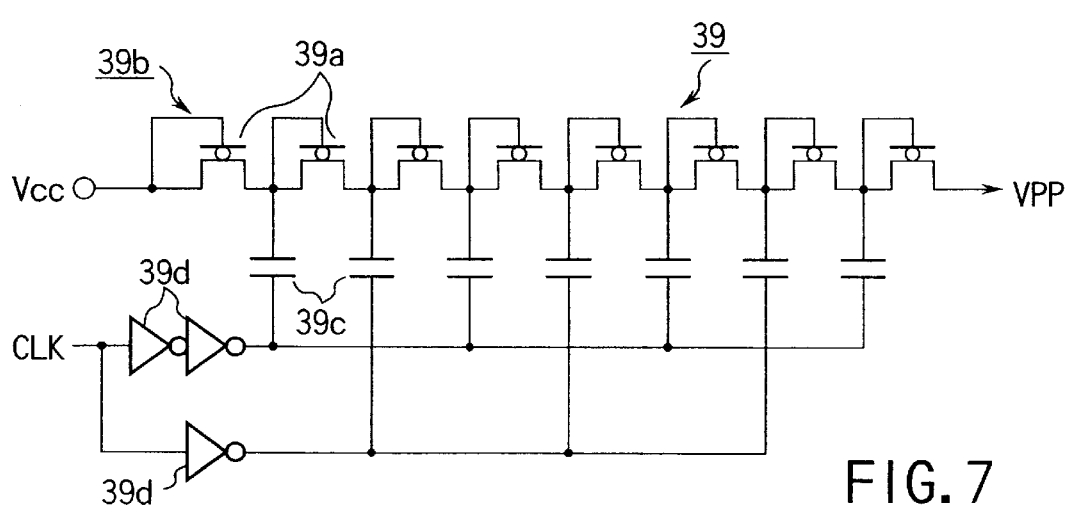
FIG. 7 is a circuit diagram showing an example of the charge pump circuit shown in FIG. 5.

FIG. 7 shows an example of the charge pump circuit 29. In the charge pump circuit 39, n-channel MOS transistors 39a diode-connected are connected in series, thereby forming a diode chain 39b. These transistors 39a are, for example, intrinsic transistors and have their threshold voltage set at about 0V. The external power source Vcc is supplied to one end of the diode chain 39b. Capacitors 39c are connected to the junctions of the transistors 39a in such a manner that one end of each capacitor 39c is connected to the corresponding junction node. To the other end of each capacitor 39c, a clock signal CLK supplied from an oscillator (not shown) is supplied via inverter circuits 39d. The charge pump circuit 39 supplies the clock signal CLK to the capacitors 39c alternately, thereby outputting the boosted voltage VPP at the output terminal.

First Embodiment

Figure 8:
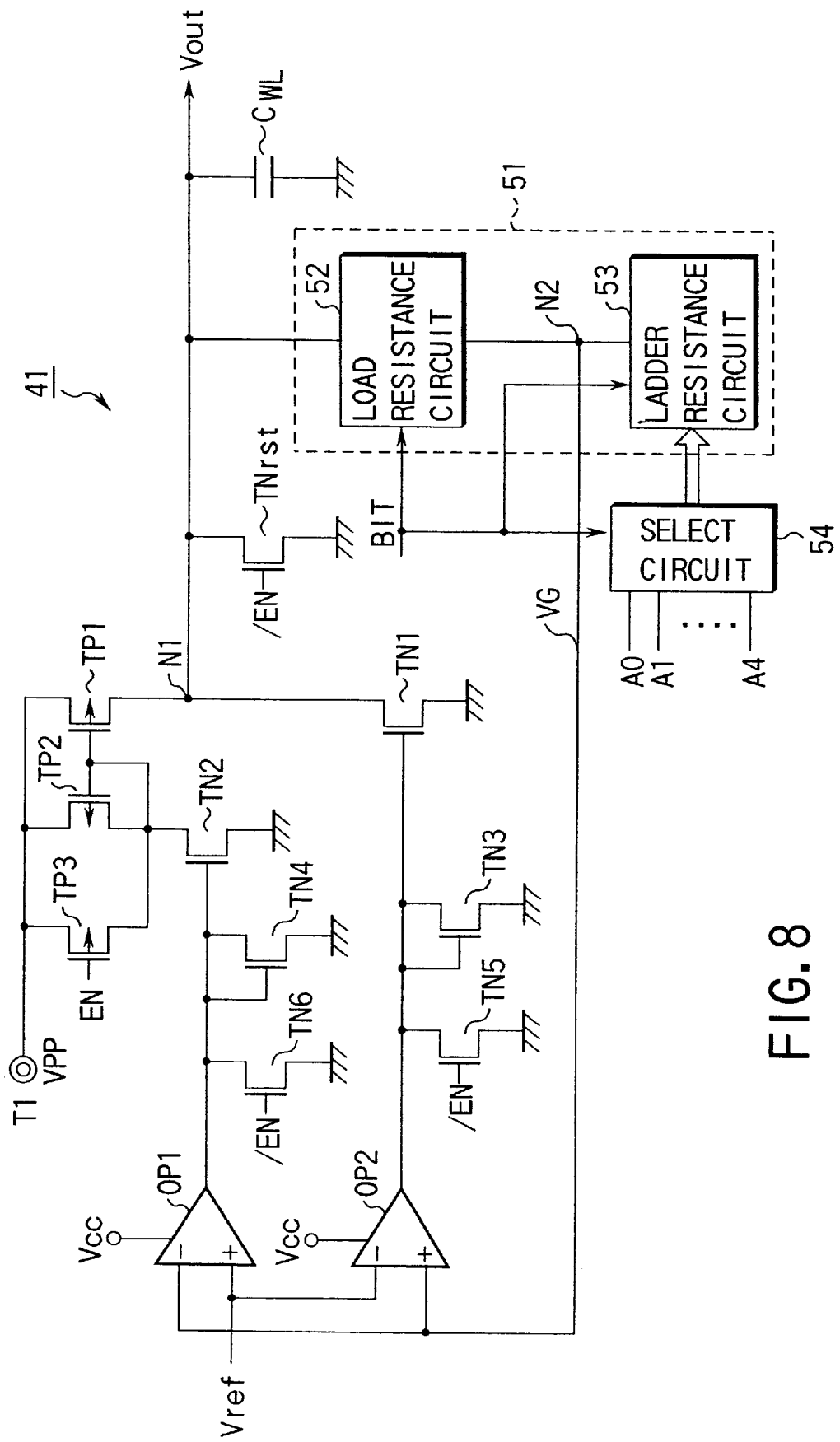
FIG. 8, which shows a first embodiment of the present invention, is a circuit diagram of the internal voltage generating circuit shown in FIG. 5.

FIG. 8, which shows a first embodiment of the present invention, shows a circuit configuration of the internal voltage generating circuit 41. In FIG. 8, a reference voltage Vref is supplied to the noninverting input terminal of a differential amplifier OP1. The output voltage VG of a voltage setting circuit 51, explained later, is supplied to the inverting input terminal of the differential amplifier OP1. The gate of an n-channel MOS transistor TN2 is connected to the output terminal of the differential amplifier OP1. N-channel MOS transistors TN4 and TN6 are connected in parallel between the output terminal of the differential amplifier OP1 and the ground. The gate of the transistor TN4 is connected to the output terminal of the differential amplifier OP1. The inverted signal /EN of an enable signal EN is supplied to the gate of the transistor TN6.

The source of the transistor TN2 is grounded. Between the drain of the transistor TN2 and a power supply terminal T1 to which the boosted voltage VPP is supplied, p-channel MOS transistors TP2 and TP3 are connected in parallel. The enable signal EN is supplied to the gate of the transistor TP3. The gate of the transistor TP2 is connected to the drain of the transistor TN2 and the gate of the p-channel MOS transistor TP1. The transistor TP1 has its source connected to the power supply terminal T1 and its drain connected to an output node N1. The transistor TP1 pulls up the level at the output node N1 according to the output of the differential amplifier OP1.

The reference voltage Vref is supplied to the inverting input terminal of the differential amplifier OP2. The output voltage VG of the voltage setting circuit 51 is supplied to the noninverting input terminal of the differential amplifier OP2. The output terminal of the differential amplifier OP2 is connected to the gate of an n-channel MOS transistor TN1. The transistor TN1 has its source grounded and its drain connected to the output node N1. The transistor TN1 pulls down the level at the output node N1 according to the output voltage of the differential amplifier OP2.

Between the output terminal of the differential amplifier OP2 and the ground, n-channel MOS transistors TN3 and TN5 are connected in parallel. The gate of the transistor TN3 is connected to the output terminal of the differential amplifier OP2. The inverted signal /EN of an enable signal is inputted to the gate of the transistor TN5.

The current driving force of the transistors TP2, TP3, TN2, and TN4 is set so as to be smaller than the current driving force of the pull-up transistor TP1. The current driving force of the transistor TN3 is set so as to be smaller than the current driving force of the pull-down transistor TN1. The current driving force of these transistors is set by changing, for example, the channel width of the transistor. Specifically, the channel width of each of the transistors TP2, TP3, TN2, and TN4 is set smaller than that of the transistor TP1. The channel width of TN3 is set smaller than that of the transistor TN1.

The transistors TN5 and TN6 have only to be able to reset the potential of the output terminal of each of the differential amplifiers OP1 and OP2, when the enable signal /EN is high. They are not particularly limited by the size of the transistor.

The voltage setting circuit 51 is connected to the output node N1. The voltage setting circuit 51 is composed of a load resistance circuit 52 and a ladder resistance circuit 53. A select circuit 54 is connected to the ladder resistance circuit 53. Address signals A0, A1 to A4 (second control signals) are supplied to the select circuit 54. These address signals A0, A1 to A4 are selectively supplied to the ladder resistance circuit 53 according to a control signal explained later. The resistance value of the load resistance circuit 52 is changed according to signals BIT2, BIT4, and BIT 5 (first control signals) explained later. The resistance value of the ladder resistance circuit 53 is changed according to the signals BIT2, BIT4, and BIT 5 and the address signals A0, A1 to A4 supplied from the select circuit 54. The junction node N2 of the load resistance circuit 52 and ladder resistance circuit 53 is the output terminal of the voltage setting circuit 51. The voltage VG at the output terminal is changed according to a change in the resistance values of the load resistance circuit 52 and ladder resistance circuit 53.

Between the output node N1 and the ground, an n-channel MOS transistor TNrst is connected. The inverted signal /EN of an enable signal is supplied to the gate of the transistor TNrst. The transistor TNrst resets the potential at the output node N1 according to the signal /EN.

In addition, a capacitor $C_{WL}$ is connected between the output node N1 and the ground. The capacitor $C_{WL}$ compensates for a phase delay in the feedback loop of the differential amplifiers OP1 and OP2, preventing the output voltage Vout from oscillating, which enables a stable operation.

Figure 9A:
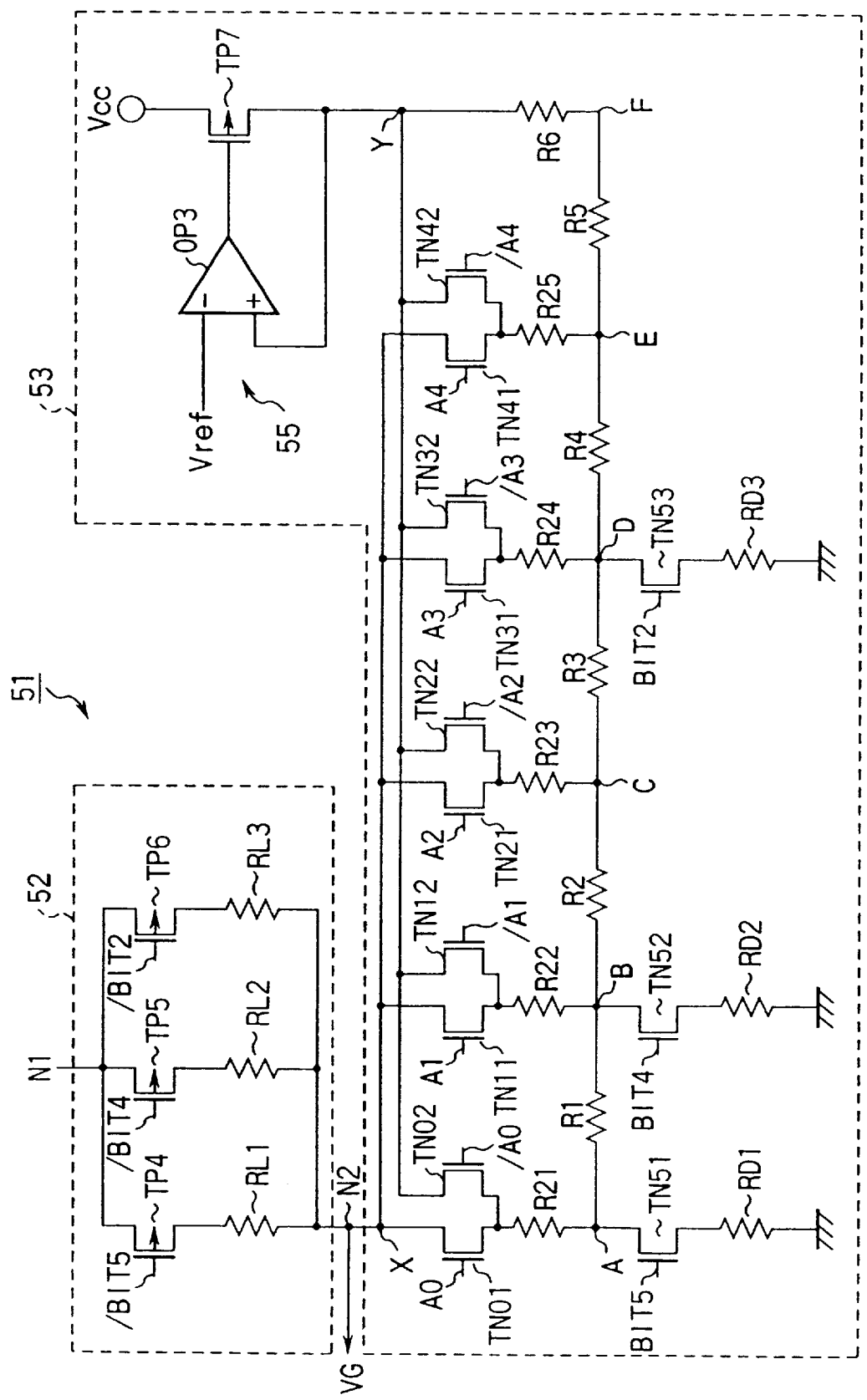
FIGS. 9a and 9b are circuit diagrams of examples of the voltage setting circuit shown in FIG. 8.
Figure 9B:
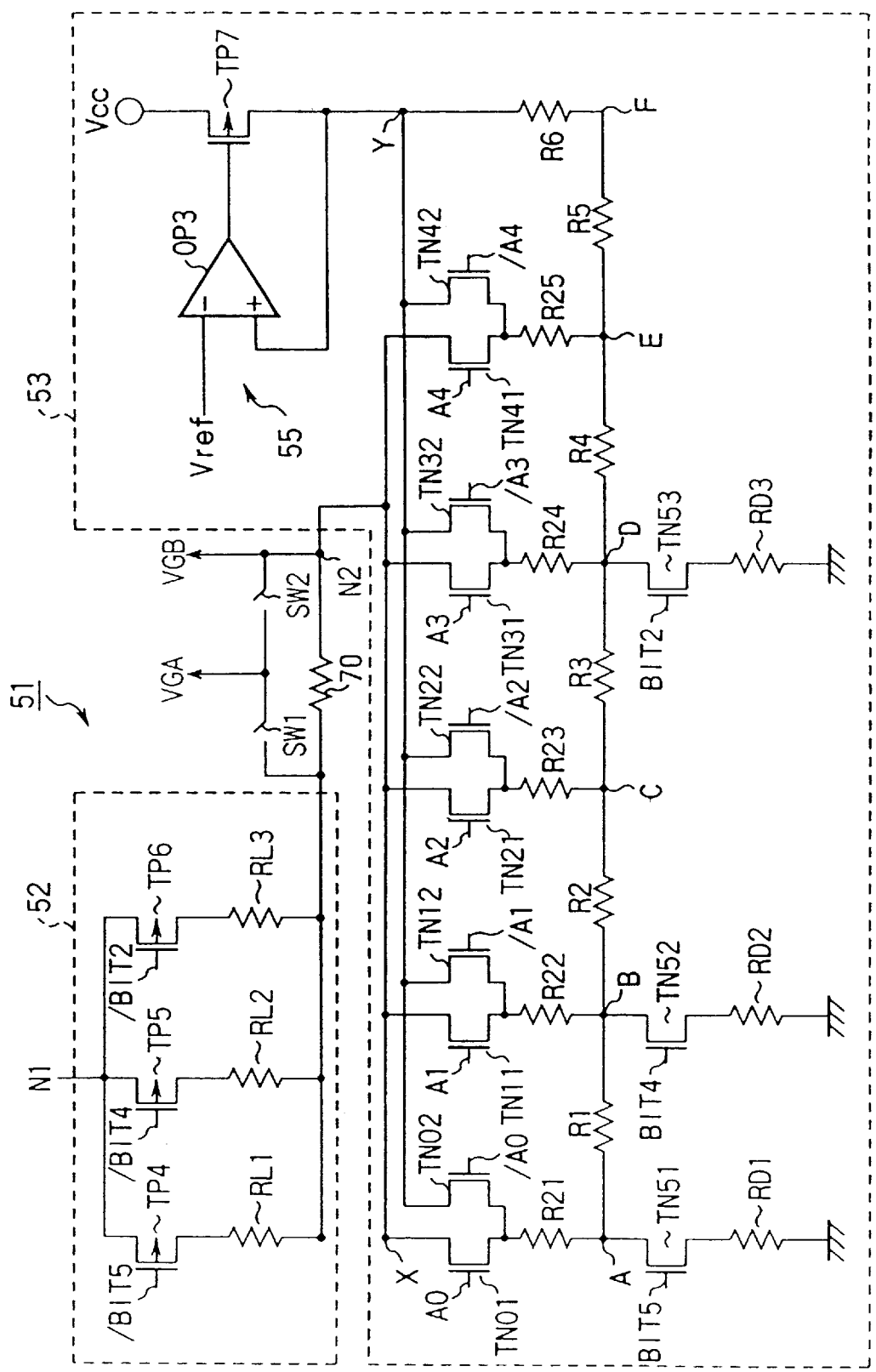

FIG. 9 shows the configuration of the voltage setting circuit 51. The voltage setting circuit 51 is composed of a so-called current-summing D/A converter. A load resistance circuit 52 is composed of resistances RL1, RL2, and RL3 and p-channel MOS transistors TP4, TP5, and TP6 for selecting the resistances RL1, RL2, RL3, which are all inserted between the output node N1 and junction node N2. Specifically, a series circuit of the transistor TP4 and resistance RL1, a series circuit of the transistor TP5 and resistance RL2, and a series circuit of the transistor TP6 and resistance RL3 are connected in parallel between the output node N1 and the junction node N2. The inverted signal /BIT5 of signal BIT5 is supplied to the gate of the transistor TP4, the inverted signal /BIT4 of signal BIT4 is supplied to the gate of the transistor TP5, and the inverted signal /BIT2 of signal BIT2 is supplied to the gate of the transistor TP6. The resistances RL1, RL2, and RL3 differ in resistance value. The relationship between the resistance values is expressed as RL1>RL2>RL3.

The signals BIT5, BIT4, and BIT2 are signals to select the range of the output voltage Vout. These signals BIT5, BIT4, and BIT2 limit the number of bits in the address signals A0, /A0 to A4, /A4 supplied to the ladder resistance circuit 53 explained later. Specifically, in a 5-bit operation mode using all the 5-bit address signals A0, /A0 to A4, /A4 , signal BIT5 is activated. In a 4-bit operation mode using 4 bits (A1, /A1 to A4, /A4) in the 5-bit address signals, signal BIT4 is activated. In a 2-bit operation mode using 2 bits (A3, /A3 to A4, /A4) in the 5-bit address signals, signal BIT2 is activated. The ladder resistance circuit 53 changes the address signal in the range of the output voltage selected by the signals BIT5, BIT4, and BIT2, thereby changing the output voltage Vout. Signals BIT5, BIT4, and BIT2 are created by using, for example, address signals A0 to A4. Alternatively, signals BIT5, BIT4, and BIT2 may be supplied from the outside.

In the ladder resistance circuit 53, resistances R1, R2, R3, R4, and R5 are connected in series between junction node A and junction node F and a resistance R6 is connected between junction node F and junction node Y. Resistances R21, R22, R23, R24, and R25 are connected to junction node A and junction nodes B, C, D, and E of the resistance R1 to resistance R5 in such a manner that one of each of the resistances R21 to R25 is connected to the corresponding junction node. Between the other ends of the resistances R21, R22, R23, R24, and R25 and a first node X, n-channel MOS transistors TN01, TN11, TN21, TN31, and TN41 are connected respectively. In addition, between the other ends of the resistances R21, R22, R23, R24, and R25 and a second node Y, n-channel MOS transistors TN02, TN12, TN22, TN32, and TN42 are connected respectively. Address signals A0, A1, A2, A3, and A4 are supplied to the gates of the transistors TN01, TN11, TN21, TN31, and TN41, respectively. Address signals /A0, /A1, /A2, /A3, and /A4 are supplied to the gates of the transistors TN02, TN12, TN22, TN32, and TN42, respectively. The resistances R1, R2, R3, R4, R5, and R6 have the same resistance value and the resistances R21, R22, R23, R24, and R25 have the same resistance value. If the resistance value of each of R1, R2, R3, R4, R5 is R, the resistance value of the resistances R21, R22, R23, R24, and R25 is set at 2R.

In addition, an n-channel MOS transistor TN 51 and a resistance RD1 are connected in series between the junction node A and the ground. An n-channel MOS transistor TN 52 and a resistance RD2 are connected in series between the junction node B and the ground. An n-channel MOS transistor TN 53 and a resistance RD3 are connected in series between the junction node D and the ground. Signals BIT5, BIT4, and BIT2 are supplied to the gates of the transistors TN51, TN52, and TN53, respectively. The resistances RD1, RD2,and RD3 differ in resistance value. The relationship between these resistances is expressed as RD1>RD2>RD3.

A current source circuit 55 is connected to the second node Y. The current source circuit 55 is composed of a differential amplifier OP3 and a p-channel MOS transistor TP7 whose gate is connected to the output terminal of the differential amplifier OP3. The differential amplifier OP3 compares the reference voltage Vref with the voltage at the second node Y. The supply voltage Vcc is supplied to the source of the transistor TP7, whose drain is connected to the second node Y.

Figure 10:
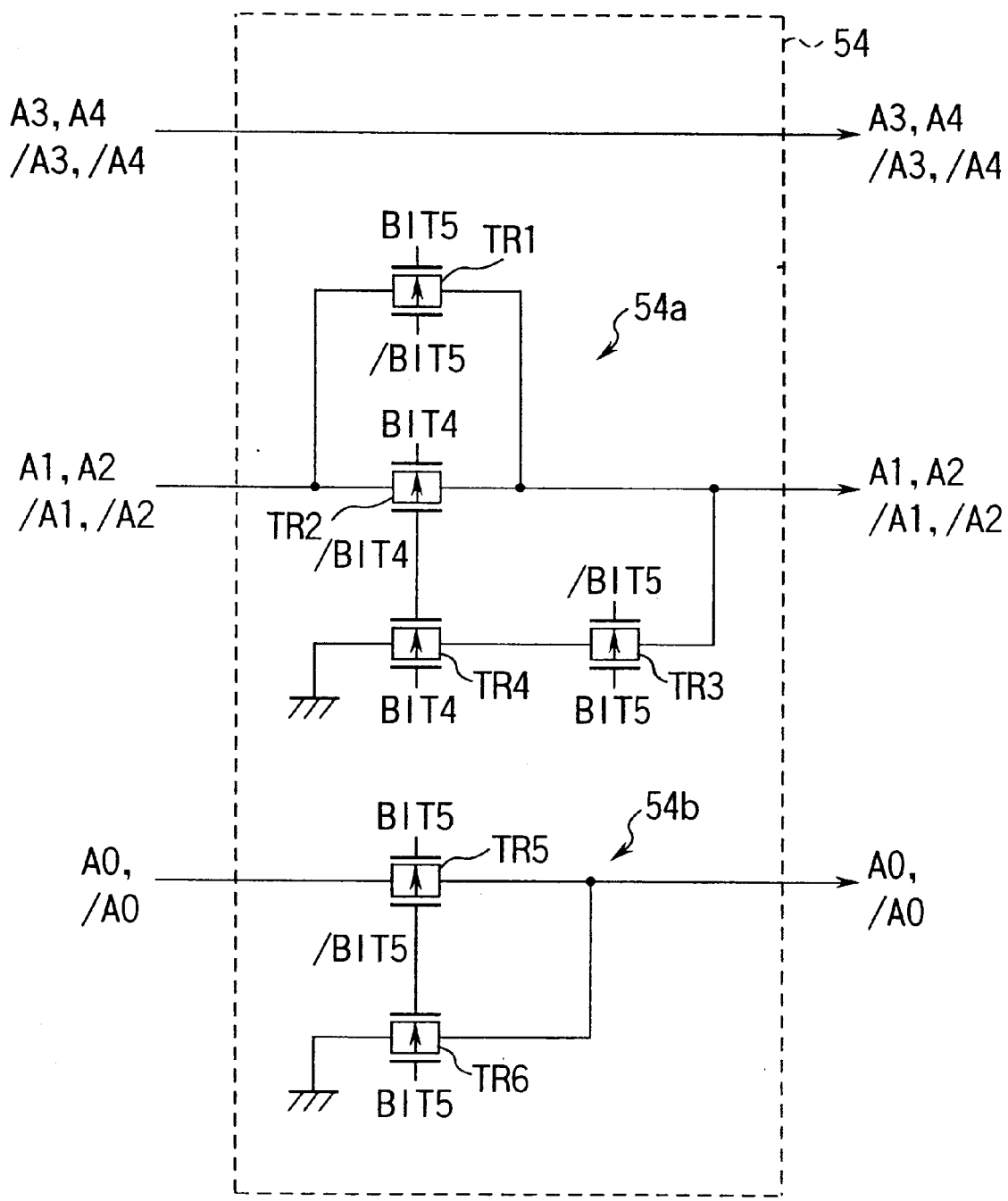
FIG. 10 is a circuit diagram of an example of the select circuit shown in FIG. 8.

FIG. 10 shows the select circuit 54 for the address signal.

As shown in FIG. 10, address signals A3, A4, /A3, /A4 are supplied directly to the gates of the transistors TN31, TN32, TN41, and TN42, respectively.

Address signals A1, A2, /A1, /A2 are supplied via first select circuits 54a to the gates of the transistors TN11, TN12, TN21, and TN22, respectively. Specifically, four first select circuits 54a are provided so as to correspond to the respective address signals. In the first select circuit 54a, address signals A1 (A2, /A1, /A2) are supplied to the input terminal of transfer gates TR1 and TR2 connected in parallel. These transfer gates TR1 and TR2 are controlled by signals BIT5, /BIT5 and signals BIT4, /BIT4. Transfer gates TR3 and TR4 are connected in series between the output terminal of the transfer gates TR1 and TR2 and the ground. These transfer gates TR3 and TR4 are controlled by signals BIT5, /BIT5 and signals BIT4, /BIT4.

With the above configuration, when the signals BIT4, /BIT4 are activated, the transfer gate TR2 is made conducting and the other transfer gates TR1, TR3, and TR4 are made nonconducting. As a result, the address signals A1, A2, /A1, /A2 are supplied via the transfer gate TR2 to the gates of the corresponding transistors TN11, TN12, TN21, and TN22.

In addition, when the signal BIT5, /BIT5 are activated, the transfer gate TR1 is made conducting and the other transfer gates TR2, TR3, and TR4 are made nonconducting. As a result, the address signals A1, A2, /A1, /A2 are supplied via the transfer gate TR11 to the gates of the corresponding transistors TN11, TN12, TN21, and TN22. When the signal BIT4, /BIT4 and BIT5, /BIT5 are deactivated, the transfer gates TR3 and TR4 are made conducting and the gates of the transistors TN11, TN12, TN21, and TN22 are placed at the ground potential.

The address signals A0, /A0 are supplied to the gates of the transistors TN01, TN02 via second select circuits 54b. Two select circuits 54b are provided so as to correspond to the address signals A0, /A0, respectively. In the second select circuit 54b, the address signal A0 (/A0) is supplied to the input of the transfer gate TR5. Between the output terminal of the transfer gate TR5 and the ground, a transfer gate TR6 is connected in series. These transfer gates TR5 and TR6 are selectively controlled by the signals BIT5, /BIT5.

With the above configuration, when the signals BIT5, /BIT5 are activated, the transfer gate TR5 is made conducting and the transfer gate TR6 is made nonconducting. As a result, the address signals A0, /A0 are supplied via the transfer gate TR5 to the gates of the corresponding transistors TN01 and TN02, respectively. When the signal BIT5, /BIT5 are deactivated, the transfer gate TR6 is made conducting, placing the gates of the transistors TN01 and TN02 at the ground potential.

Referring to FIGS. 8 to 11, the operation of the first embodiment will be explained.

In FIG. 8, when the internal voltage generating circuit 41 is placed in the unoperated state, the signal EN is made low and the signal /EN is made high. Then, the transistors TN5 and TN6 turn on, placing the output signals of the differential amplifiers OP1 and OP2 at the ground potential. At this time, the transistor TP3 also turns on, supplying the voltage VPP to the gate of the transistor TP1. As a result, the transistor TP1 is turned off. Moreover, in response to the signal /EN, the transistor TNrst is turned on, bringing the voltage Vout at the output node N1 to the ground potential.

When the internal voltage generating 41 circuit is brought into operation, the signal EN is made high and the signal /EN is made low.

The voltage setting circuit 51 of FIG. 9 can switch the range of the output voltage Vout according to the signals BIT5, BIT4, and BIT2. Specifically, when the signal BIT2 is activated in the 2-bit operation mode, the transistor TP6 in the load resistance circuit 52 is turned on, selecting the resistance RL3. At the same time, the transistor TN53 is turned on, selecting the resistance RD3. When the signal BIT2 is activated, the other signals BIT5 and BIT4 are deactivated. As a result, both of the output signals of the first and second supply circuits 54a and 54b of FIG. 10 are placed at the ground potential. Thus, the transistors TN31, TN32, TN41, and TN42 are selectively activated according to the address signals A3, /A3, A4, /A4.

Furthermore, when the signal BIT4 is activated in the 4-bit operation mode, the transistor TP5 in the load resistance circuit 52 is turned on, selecting the resistance RL2. At the same time, the transistor TN52 is turned on, selecting the resistance RD2. When the signal BIT4 is activated, the other signals BIT5 and BIT2 are deactivated. As a result, both of the output signals of the first and second supply circuit 54a and 54b of FIG. 10 are placed at the ground potential. Thus, the transistors TN11, TN21, TN22, TN31, TN41, and TN42 are selectively activated according to the address signals A1, /A1, A2, /A2, A3, /A3, and A4, /A4.

In addition, when the signal BIT5 is activated in the 5-bit operation mode, the transistor TP4 in the load resistance circuit 52 is turned on, selecting the resistance RL1. At the same time, the transistor TN51 is turned on, selecting the resistance RD1. When the signal BIT5 is activated, the other signals BIT4 and BIT2 are deactivated. At this time, the first and second select circuits 54a and 54b of FIG. 10 output the corresponding address signals. As a result, all the transistors TN01, TN01, TN11, TN12, TN21, TN22, TN31, TN32, TN41, and TN42 are selectively activated by using all the address signals A0, /A0, A1, /A1, A2, /A2, A3, /A3, and A4, /A4.

In each of the operation modes, the value of the resistance connected between the output node N1 and the ground is changed. As a result, the potential at the junction node N2 between the load resistance circuit 52 and ladder resistance circuit 53 changes. The potential at the junction node N2 is compared with the reference voltage Vref at the differential amplifiers OP1, OP2 shown in FIG. 8. According to the result of the comparison at the differential amplifiers OP1, OP2, either the transistor TP1 or TN1 is operated, thereby charging or discharging the output node N1. As the potential at the output node N1 changes, the potential at the junction node N2 changes. The potential at the junction node N2 is compared again with the reference potential Vref at the differential amplifiers OP1, OP2. Such an operation is repeated, with the result that the potential at the junction node N2 (the first node X) becomes almost equal to the reference potential Vref. In addition, the potential at the second node Y is made almost equal to the reference potential Vref by the current source circuit 55. As a result, in the steady state, the potential at each of the first and second nodes X and Y is made almost equal to the reference potential Vref.

The operation of the circuit shown in FIG. 8 will be described in further detail. When the address signal is changed in each of the operation modes, the voltage VG at the junction node N2 of the load resistance circuit 52 and ladder resistance circuit 53 changes. The voltage VG is supplied to the differential amplifiers OP1, OP2 of FIG. 8. The differential amplifiers OP1, OP2 compare the voltage VG with the reference voltage Vref. When the voltage VG is lower than the reference voltage Vref, the output signal of the differential amplifier OP1 goes high and the output signal of the differential amplifier OP2 goes low. As a result, the transistor TN2 turns on, transistor TN1 turns off, and transistor TP1 charges the output node N1. This causes the output voltage Vout to rise. As the output voltage Vout rises, the voltage VG at the junction node N2 rises. When the voltage VG becomes almost equal to the reference voltage Vref, the output signal of the differential amplifier OP1 becomes slightly high, with the result that, the transistors TN2, TP1 are slightly conducting and the output voltage Vout is in the stable state.

On the other hand, when the voltage VG is higher than the reference voltage Vref, the output signal of the differential amplifier OP1 goes low and the output signal of the differential amplifier OP2 goes high. As a result, the transistor TN2 turns off, transistor TN1 turns on, and transistor TN1 discharges the charges from the output node N1. This causes the output voltage Vout to drop. As the output voltage Vout drops, the voltage VG at the junction node N2 drops. When the voltage VG becomes almost equal to the reference voltage Vref, the output signal of the differential amplifier OP2 becomes slightly high. This causes the transistors TN1 to conduct slightly and the output voltage Vout is in the stable state.

Figure 11:
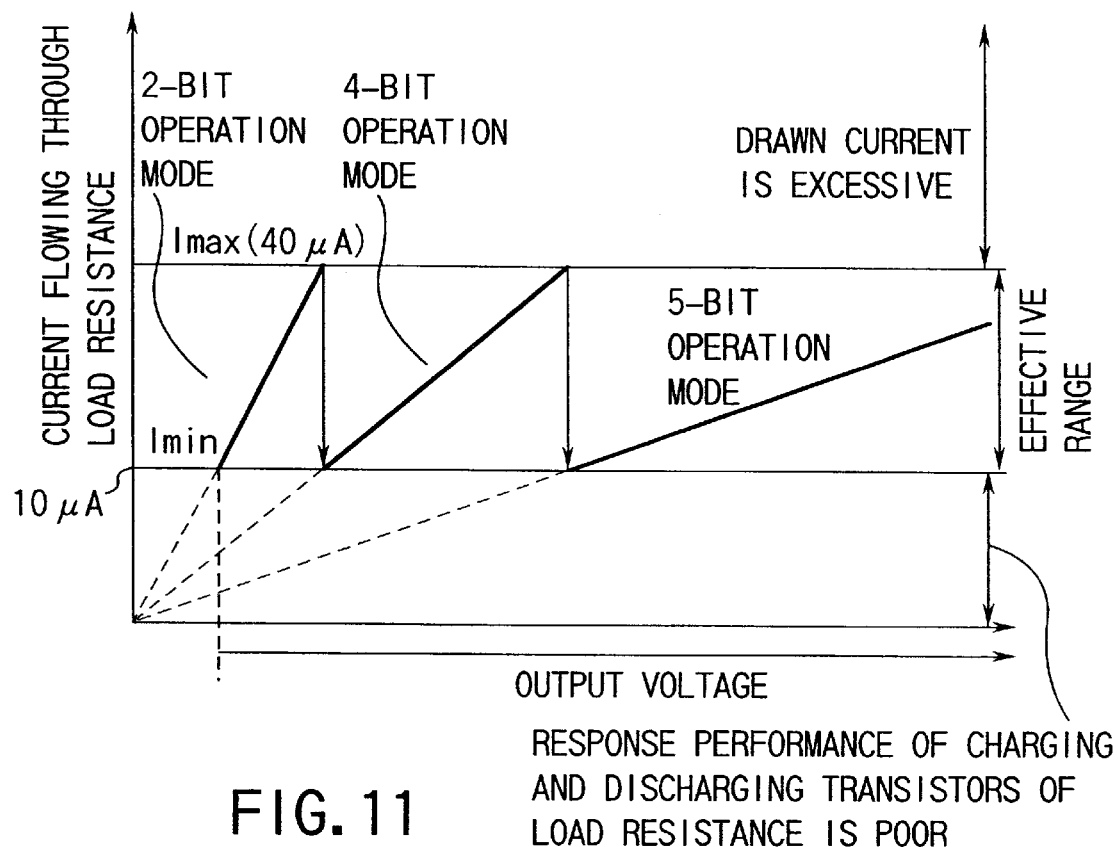
FIG. 11 shows the operating characteristic of the first embodiment.

FIG. 11 shows the relationship between the output current and the current flowing through the load resistance in each of the operation modes. As shown in FIG. 11, in each of the 2-bit operation mode, 4-bit operation mode, and 5-bit operation mode, the minimum value Imin and maximum value Imax of the current flowing through each of the load resistances RL1, RL2, and RL3 are made equal by suitably setting the load resistances RL1, RL2, RL3 and the resistances RD1, RD2, RD3. In the effective range from the minimum value Imin to maximum value Imax of the current flowing through the load resistance RL, the range of the output voltage Vout that can be outputted in each of the 2-bit operation mode, 4-bit operation mode, and 5-bit operation is limited.

In the case of the embodiment, it is assumed that the values of the resistances constituting the load resistance circuit 52 and ladder resistance circuit 53 are set as follows: for example, R1 to R6=R=25 kΩ, R21 to R25=2R=50 kΩ, RL3=25 kΩ (in the 2-bit operation mode), RL2=100 kΩ (in the 4-bit operation mode), RL1=400 kΩ (in the 5-bit operation mode), resistance RD3=6.25 kΩ (in the 2-bit operation mode), RD2=100 kΩ (in the 4-bit operation mode), and RD1=475 kΩ (in the 5-bit operation mode). In this case, the effective range of current flowing through the load resistance is set as follows: Imin=10 µA and Imax=40 µA.

In the above condition, the minimum add current value (an increment in the current caused by the change of the address signal) in the 2-bit operation mode is 10 µA, the minimum add current value in the 4-bit operation mode is 2.5 µA, and the minimum add current value in the 5-bit operation mode is 1.25 µA. The output voltage Vout changes in steps of 0.25V in the range of 1.5V to 9V.

In FIG. 11, consider a case where voltages are generated by changing the address sequentially in the 2-bit operation mode. Since the minimum add current value in the 2-bit operation mode is larger than that in the other operation modes, as the address increases, the current added increases sharply. For this reason, the 2-bit operation mode is changed to the 4-bit operation mode just before the maximum current Imax flowing through RL3 (or just before the drawn current becomes excessive). At the time of the first address in the 4-bit operation mode, the value of the current flowing through the load resistance RL2 returns to the minimum value Imin that assures the response performance. When the address increases beyond the state, the value of the current flowing through the load resistance RL2 increases because of the minimum add current smaller than that in the 2-bit operation mode. The 4-bit operation mode is changed to the 5-bit operation mode just before the maximum current Imax flowing through the load resistance (or just before the drawn current becomes excessive). When the address increases in the 5-bit operation mode, the value of the current flowing through the load resistance RL1 increases because of the minimum add current smaller than that in the 4-bit operation mode.

The switching between the 2-bit operation mode, 4-bit operation mode, and 5-bit operation mode need not be effected sequentially as described above. They have only to be switched according to the generation of the voltages necessary for the operation of a nonvolatile semiconductor memory. For example, in programming, setting a large address in the 5-bit operation mode enables as high a voltage as 9V to be generated. When weak programming is done after an overerase verify operation, the 2-bit operation mode is turned on and the address is increased, starting at a small address.

With the first embodiment, the load resistances RL1, RL2, RL3 in the load resistance circuit 52 and the resistances RD1, RD2, RD3 in the ladder resistance circuit 53 are switched in each of the 2-bit operation mode, 4-bit operation mode, and 5-bit operation mode. This enables current in a suitable range to be supplied to the load resistances RL1, RL2, and RL3. As a result, a desired output voltage can be generated at high speed, regardless of the generated output voltage.

Previously, when a voltage of a level close to the reference voltage Vref was generated, the response performance was impaired. With the first embodiment, however, when the minimum add current value is increased in the 2-bit operation mode, the response performance is guaranteed in generating a voltage whose level is close to that of the reference voltage Vref.

In addition, since a current in the suitable range can be supplied to the load resistances RL1, RL2, RL3 in each of the operation modes, the drawn current is prevented from increasing, regardless of the level of the generated output voltage.

Figure 12:
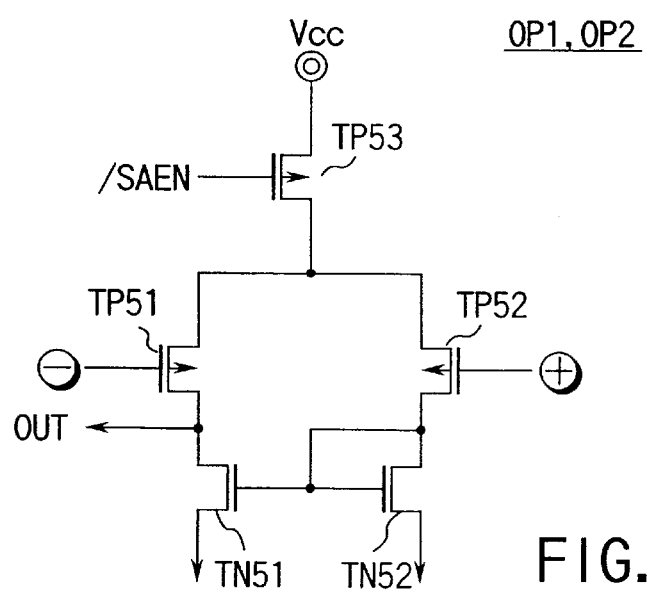
FIG. 12 is a circuit diagram of an example of the differential amplifier shown in FIG. 8.

FIG. 12 shows an example of the differential amplifiers OP1, OP2 shown in FIG. 8. The differential amplifiers OP1, OP2 drive the n-channel MOS transistors TN1, TN2. For this reason, the differential amplifiers OP1, OP2 have a current-mirror circuit composed of n-channel transistors well matching with the transistors TN, TN2. Specifically, the sources of the n-channel MOS transistors TN51, TN52 are grounded. The gates of the n-channel MOS transistors TN51, TN52 are connected to each other. The junction of the n-channel MOS transistors TN51, TN52 is connected to the drain of the transistor TN52. The sources of the p-channel MOS transistors TP51, TP52 are connected to a terminal to which, for example, the power source vcc is supplied via the p-channel MOS transistor TP53. The drains of the p-channel MOS transistors TP51, TP52 are connected to the drains of the transistors TN11, TN52, respectively. A control signal /SAEN is supplied to the gate of the transistor 53.

The gate of the transistor TP51 is an inverting input terminal and the gate of the transistor TP52 is a noninverting input terminal. The junction node of the transistors TP51 and TN51 is an output terminal.

The transistors TN51, TN52 constituting the current mirror circuit have the same gate oxide film thickness. This cancels variations in the threshold voltages of the transistors TN51, TN52. In the stable state where the voltage at the inverting input terminal becomes almost equal to the voltage at the noninverting input terminal, the ratio of the current flowing in the transistor TN51 and that flowing in the transistor TN52 can be made constant. Moreover, the TN1 and TN2 composed of n-channel transistors are driven by the transistor TN51 composed of an N-channel transistor. This makes the transistors match well with each other and enables a stable operation.

Second Embodiment

It is desirable that the power source of the differential amplifiers OP1, OP2 should have a stable voltage to operate the voltage generating circuit stably. When an external power source Vcc is supplied to the differential amplifiers OP1, OP2 as shown in the first embodiment, use of a lower-voltage external power source decreases the amplitude of the output voltage of the differential amplifiers. This makes it difficult to control the transistors NT1, NT2 stably by using the output voltages of the differential amplifiers OP1, OP2.

Figure 13:
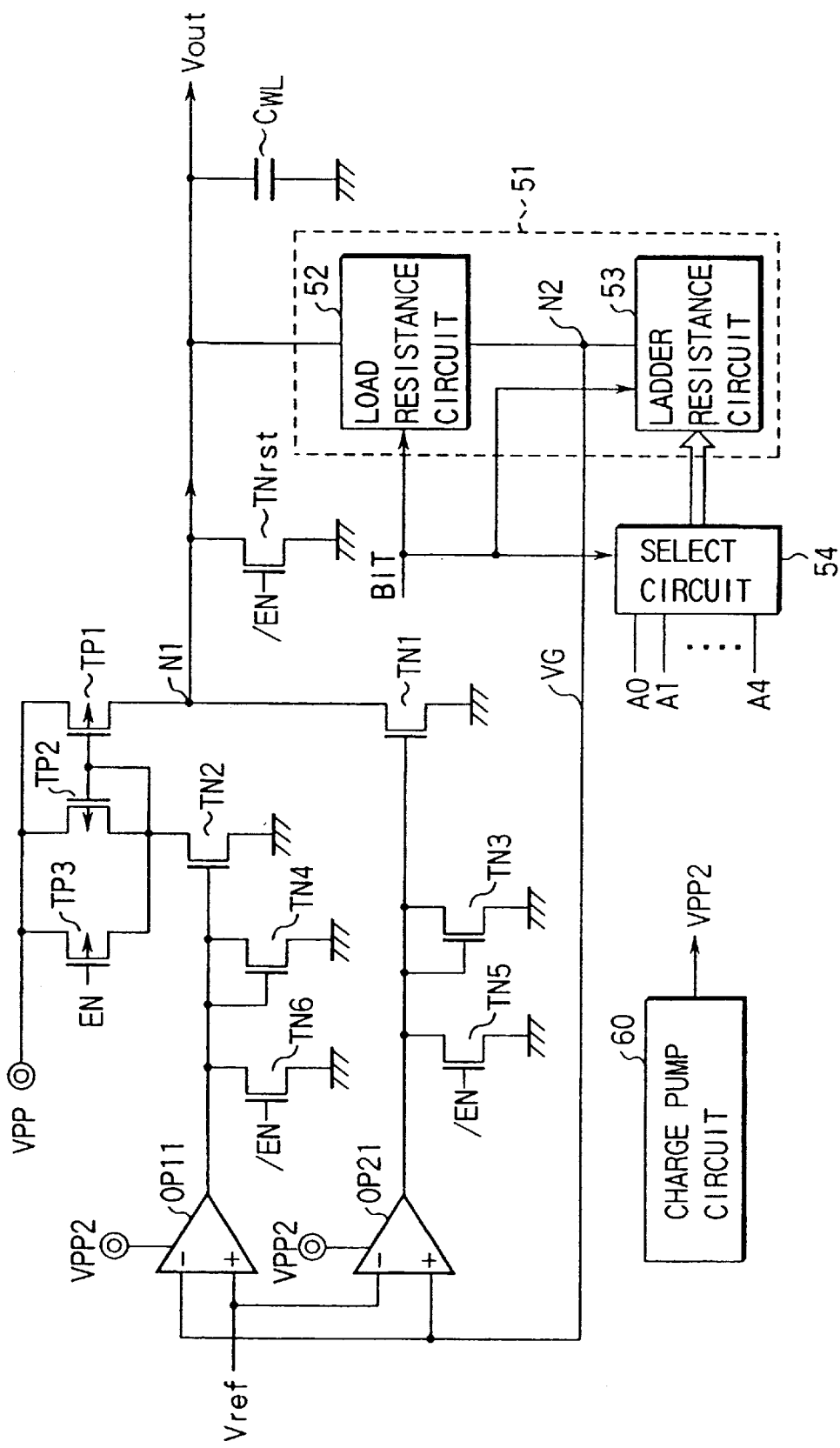
FIG. 13, which shows a second embodiment of the preset invention, is a circuit diagram showing the configuration of an internal voltage generating circuit.

FIG. 13 shows a second embodiment of the present invention. The same parts as those of FIG. 8 are indicated by the same reference symbols and only the parts differing from those of FIG. 8 will be explained.

An internal voltage generating circuit 41 of FIG. 13 differs from that of FIG. 8 in differential amplifiers OP11 and OP21. To the differential amplifiers OP11, OP21, a voltage VPP2 which is lower than, for example, the voltage VPP and equal to or higher than the supply voltage Vcc, and is less affected by fluctuations in the supply voltage Vcc. In order to operate the differential amplifiers OP11, OP21 properly, it is desirable that the voltage VPP2 should be lower than the voltage VPP and equal to or higher than the supply voltage VCC. The voltage VPP2 is generated by a different charge pump circuit 60 from the charge pump circuit 39 of FIG. 5. The configuration of the charge pump circuit 60 differs from, for example, that of FIG. 7 in that the number of transistors and capacitors is decreased.

Figure 14:
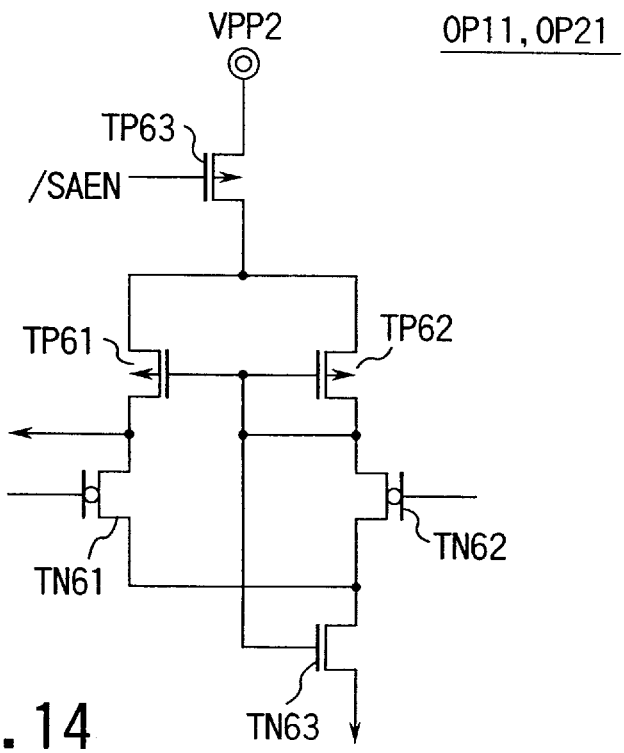
FIG. 14 is a circuit diagram of an example of the differential amplifier shown in FIG. 13.

FIG. 14 shows an example of the differential amplifiers OP11, OP12. The differential amplifiers OP11, OP21 are composed of current-mirror differential amplifiers. In FIG. 14, the sources of p-channel MOS transistors TP61, TP62 are connected via a p-channel MOS transistor TP63 to a terminal to which a power source VPP2 is supplied. The gates of the transistors TP61, TP62 are connected to each other. The junction of the transistors TP61, TP62 is connected to the drain of the transistor TP62. A control signal /SAEN is supplied to the gate of the transistor TP63.

The drains of n-channel MOS transistors TN61, TN62 are connected to the drains of the transistors TP61, TP62, respectively. The sources of the transistors TN61, TN62 are connected via an n-channel MOS transistor TN63 to the ground. The gate of the transistor TN63 is connected to the gates of the transistors TP61 and TP62.

The transistors TN61, TN62 are intrinsic transistors. Their threshold voltages are set at almost 0V. The gate of the transistor TN61 is an inverting input terminal and the gate of the transistor TN62 is a noninverting input terminal. The junction of the transistor TN61 and transistor TP61 is an output terminal. The transistor TN63 raises the source voltages of the transistors TN61, TN62, thereby increasing the sensitivity of the transistors TN61, TN62.

The transistor TN63 constituting the differential amplifiers OP11, OP21, the transistors TN2, TN6 connected to the output terminal of the differential amplifier OP11, and the transistors TN1, TN5 connected to the output terminal of the differential amplifier OP21 are formed simultaneously. As a result, the gate oxide films of these transistors have the same thickness. Accordingly, these transistors are not affected by variations in the processes, which keeps the characteristics of the circuit stable.

Furthermore, the transistor TN61 is composed of a transistor of the same conductivity type as that of the transistors TN61, TN62. This enables the output characteristic of the differential amplifiers OP11, OP21 to match with the electrical characteristic of the transistors TN1, TN2, assuring a stable operation.

In addition, the transistors TN61, TN62 are intrinsic transistors with no impurity in the channels. For this reason, there is almost no variation in the threshold voltages of the transistors TN61, TN62. As a result, they operate accurately according to the voltages supplied to the inverting input terminal and noninverting input terminal.

With the second embodiment, the voltage VPP2 is supplied to the differential amplifiers OP11, OP21. Since the voltage VPP2 is generated by the charge pump circuit 60, it is less dependent on the change of the supply voltage. Consequently, even when the supply voltage is lowered, the amplitude of the output voltages of the differential amplifiers OP1, OP21 can be secured sufficiently, assuring a stable operation.

Moreover, the differential amplifiers OP11, OP21 are composed of current-mirror differential amplifiers, thereby matching the output characteristics of the differential amplifiers OP11, OP21 with the characteristics of the transistors TN1, TN2. As a result, the circuit characteristics of the differential amplifiers OP11, OP21 can be held stable without being affected by variations in the processes.

Figure 15:
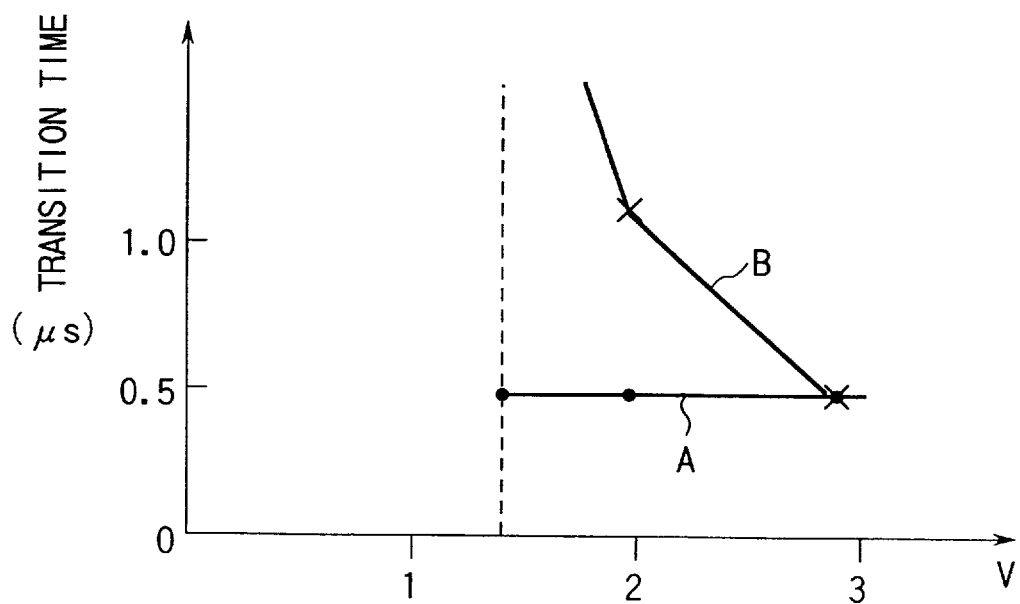
FIG. 15 shows the relationship between the transition time and external supply voltage until a specific output voltage is generated in the second embodiment of the present invention.

FIG. 15 shows the relationship between the transition time until a specific output voltage Vout is generated and the external supply voltage in the internal voltage generating circuit 41 of FIG. 13. In the case of the circuit of the second embodiment, the transition time was kept at 0.5 $\mu$s in the range of the supply voltage from about 3V to about 1.5V as shown by characteristic A. Characteristic B shows the case of the first embodiment. It can be seen from characteristic B that the transition time gets longer as the external supply voltage gets lower.

Third Embodiment

Figure 16:
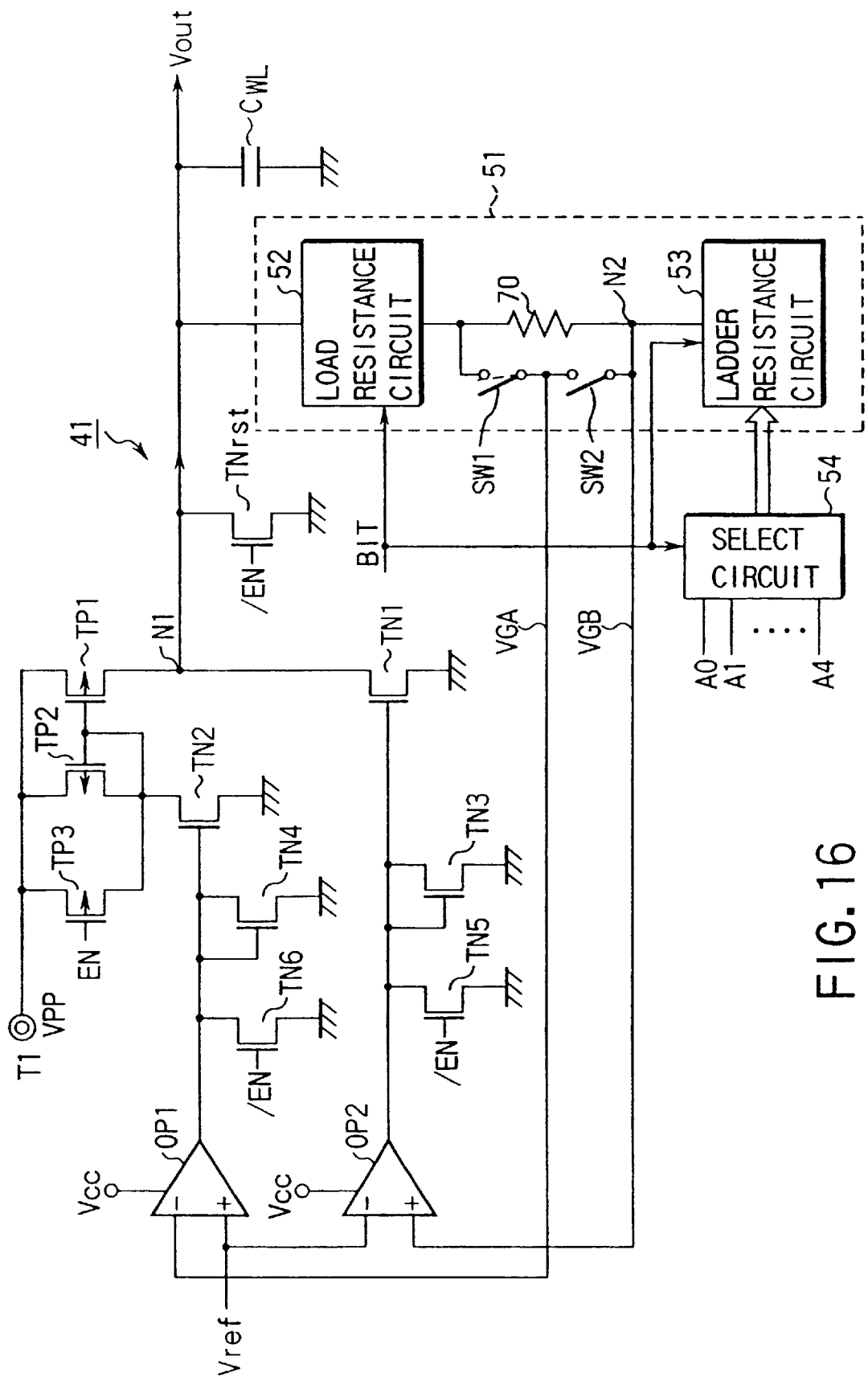
FIG. 16, which shows a third embodiment of the preset invention, is a circuit diagram showing the configuration of an internal voltage generating circuit.

FIG. 16 shows a third embodiment of the present invention. The same parts as those of FIG. 8 are indicated by the same reference symbols and only the parts differing from those of FIG. 8 will be explained.

In FIG. 16, a resistance 70 is connected between the load resistance circuit 52 and ladder resistance circuit 53. A series connection of switches SW1, SW2 is connected in parallel with the resistance 70. A voltage VGA at the junction node of the switches SW1, SW2 is supplied to the inverting input terminal of the differential amplifier OP1. A voltage VGB at the junction node of the ladder resistance circuit 53 and resistance 70 is supplied to the noninverting input terminal of the differential amplifier OP2. A reference voltage Vref is supplied to the noninverting input terminal of the differential amplifier OP1 and to the inverting input terminal of the differential amplifier OP2.

With this configuration, when the switch SW1 is turned off and the switch SW2 is turned on, the operation is almost the same as that in the first embodiment. In the third embodiment, the switch SW1 is turned on and the switch SW2 is turned off. When the switches SW1, SW2 are set this way, the resistance 70 causes a difference in potential between the voltages VGA and VGB. The relationship between the voltages VGA and VGB is expressed as VGA>VGB. In addition, the relationship between the voltages VGA, VGB in the steady state and the reference voltage Vref is expressed as VGA>Vref>VGB. The output signals of the differential amplifiers OP1, OP2 are placed at the low level in the steady state.

When the address signal has been changed in each of the operation modes and the voltages VGA, VGB have been changed, the differential amplifiers OP1, OP2 compare the voltages VGA, VGB with the reference voltage Vref. According to the result of the comparison, the transistors TN2, TP1 or the transistor TN1 is driven, thereby charging or discharging the output node N1. Then, feedback control is performed in such a manner that the voltages VGA, VGB become almost equal to the reference voltage Vref.

Figure 17:
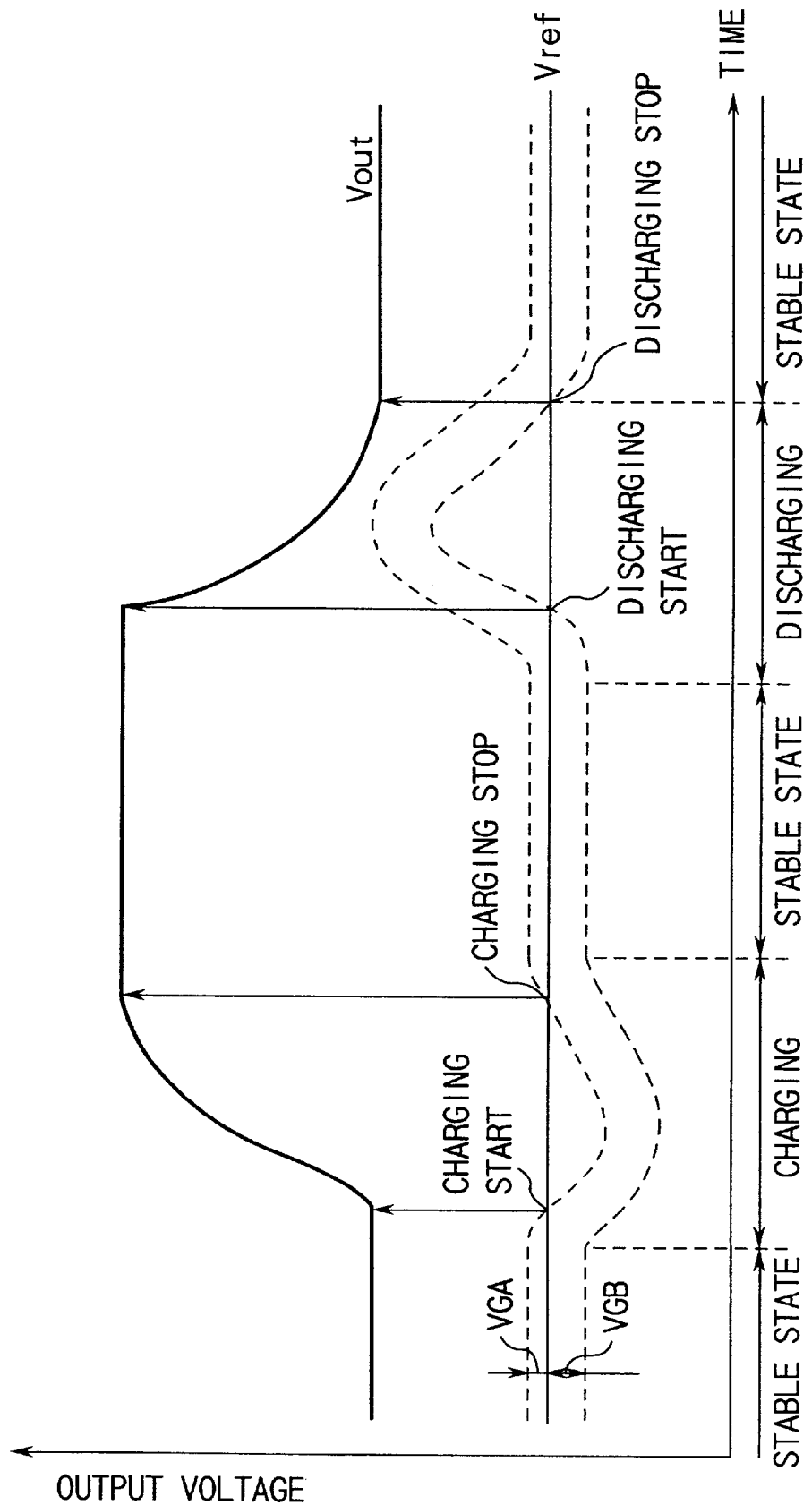
FIG. 17 is a waveform diagram to help explain the operation of FIG. 16.

FIG. 17 illustrates the charging and discharging operation of the internal voltage generating circuit 41 shown in FIG. 16. It is assumed that the change of the address signal has decreased, for example, the voltages VGA, VGB in each of the operation modes and the voltage VGA has become lower than the reference voltage Vref. On this assumption, the output signal of the differential amplifier OP1 goes high, causing the transistors TN2, TP1 to charge the output node N1. As the output voltage Vout rises, the voltages VGA, VGB rise. When the voltage VGA has become higher than the reference voltage Vref, the output signal of the differential amplifier OP1 goes low. As a result, the charging of the output node is stopped.

On the other hand, it is assumed that the change of the address signal has caused the voltages VGA, VGB to rise and the voltage VGB has become higher than the reference voltage Vref. Then, the output signal of the differential amplifier OP2 goes high, causing the transistor TN1 to discharge the output node N1. As the output voltage Vout drops, the voltage VGB drops. When the voltage VGB has become lower than the reference voltage Vref, the output signal of the differential amplifier OP2 goes low. As a result, the discharging of the output node is stopped.

With the third embodiment, there is provide a difference in potential between the voltages VGA, VGB supplied to the differential amplifiers OP1, OP2. The potential difference is so set that the output signals of the differential amplifiers OP1, OP2 are low in the steady state to positively turn off the transistors TN1, TP1. As a result, it is possible to reduce the drawn current in the steady state where the charging and discharging of the output node N1 are stopped.

Fourth Embodiment

Figure 18:
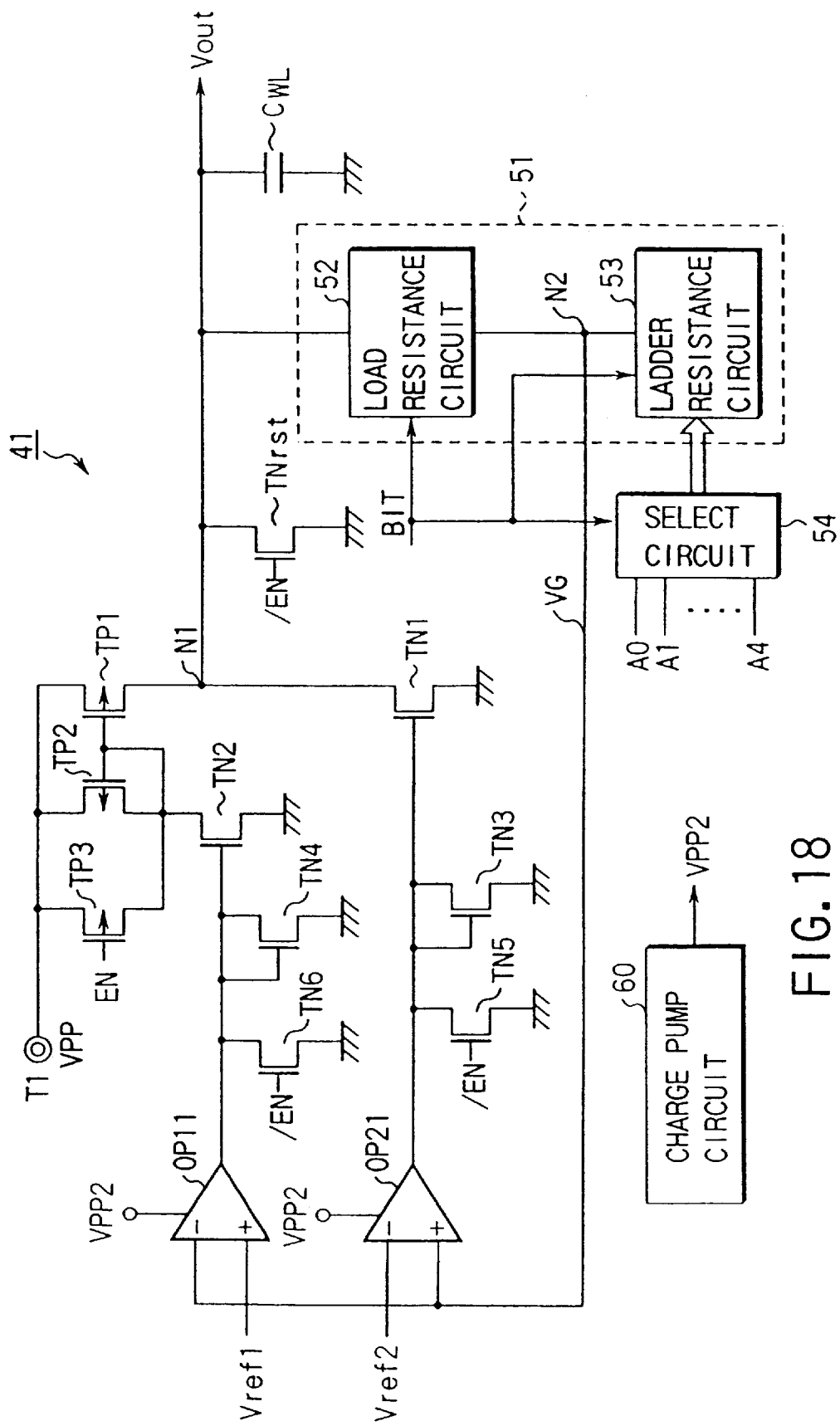
FIG. 18, which shows a fourth embodiment of the preset invention, is a circuit diagram showing the configuration of an internal voltage generating circuit.

FIG. 18 shows a fourth embodiment of the present invention. The same parts as those of FIG. 8 are indicated by the same reference symbols and only the parts differing from those of FIG. 8 will be explained.

In the fourth embodiment, a voltage VG at the junction node N2 in the voltage setting circuit 51 is supplied to the inverting input terminal of the differential amplifier OP1 and the noninverting input terminal of the differential amplifier OP2. In addition, a first reference voltage Vref1 is supplied to the noninverting input terminal of the differential amplifier OP1 and a second reference voltage Vref2 is supplied to the inverting input terminal of the differential amplifier OP2. The relationship between the first reference voltages Vref1, Vref2 and the voltage VG is expressed as Vref1<VG<Vref2. The output signals of the differential amplifiers OP1, OP2 are placed at the low level in the steady state.

When the address signal has been changed in each of the operation modes and the voltages VG has been changed, the differential amplifiers OP1, OP2 compare the voltage VG with the reference voltages Vref1, ref2. According to the result of the comparison, the transistors TN2, TP1 or the transistor TN1 is driven, thereby charging or discharging the output node N1. Then, feedback control is performed in such a manner that the voltage VG becomes almost equal to the reference voltages Vref, ref2.

Figure 19:
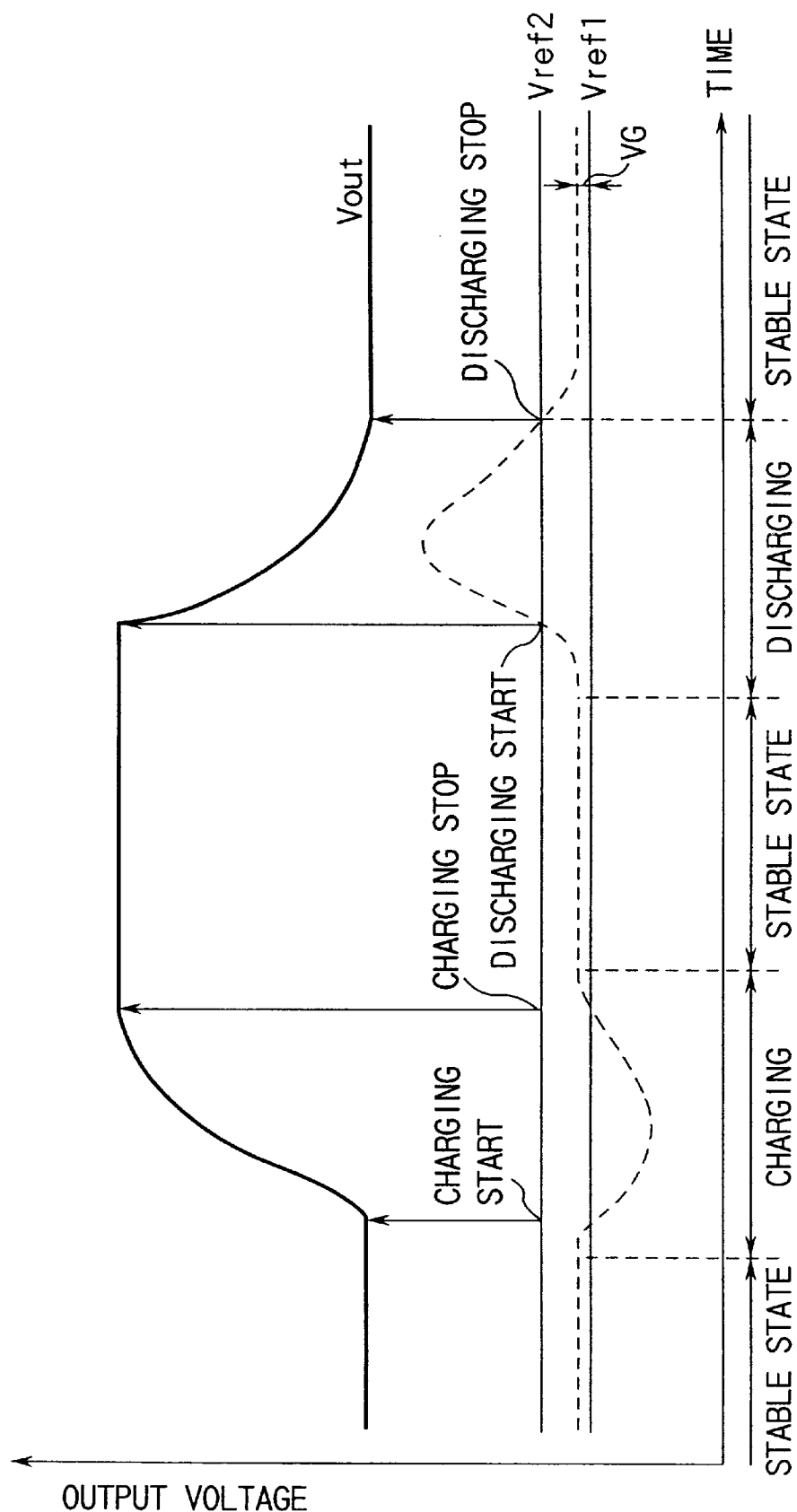
FIG. 19 is a waveform diagram to help explain the operation of FIG. 18.

FIG. 19 illustrates the charging and discharging operation of the internal voltage generating circuit 41 shown in FIG. 18. It is assumed that the change of the address signal has decreased, for example, the voltage VG in each of the operation modes and the voltage VG has become lower than the reference voltage Vref1. On this assumption, the output signal of the differential amplifier OP1 goes high, causing the transistors TN2, TP1 to charge the output node N1. As the output voltage Vout rises, the voltage VG rises. When the voltage VGA has become higher than the reference voltage Vref1, the output signal of the differential amplifier OP1 goes low. As a result, the charging of the output node is stopped.

On the other hand, it is assumed that the change of the address signal has caused the voltage VG to rise and the voltage VG has become higher than the reference voltage Vref2. Then, the output signal of the differential amplifier OP2 goes high, causing the transistor TN1 to discharge the output node N1. As the output voltage Vout drops, the voltage VG drops. When the voltage VG has become lower than the reference voltage Vref2, the output signal of the differential amplifier OP2 goes low. As a result, the discharging of the output node is stopped.

With the fourth embodiment, a first reference voltage Vref1 lower than the voltage VG in the steady state is supplied to the differential amplifier OP1 and a second reference voltage Vref2 higher than the voltage VG in the steady state is supplied to the differential amplifier OP2. As a result, in the steady state, the output signals of the differential amplifiers OP1, OP2 are low, which positively turns off the transistors TN1, TP1. Accordingly, it is possible to reduce the drawn current in the steady state where the charging and discharging of the output node N1 are stopped.

Figure 20:
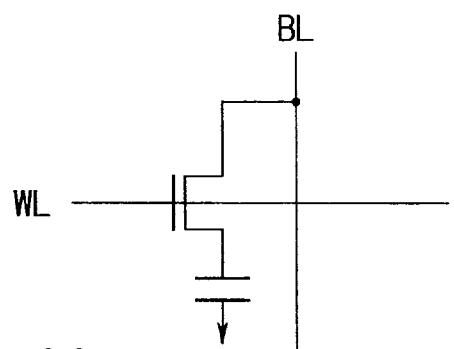
FIG. 20, which shows an example of a memory cell to which the present invention is applied, is a circuit diagram of a dynamic DRAM.
Figure 21:
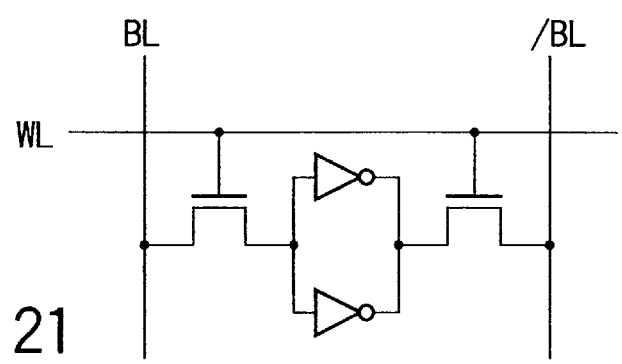
FIG. 21, which shows an example of a memory cell to which the present invention is applied, is a circuit diagram of a static RAM.
Figure 22:
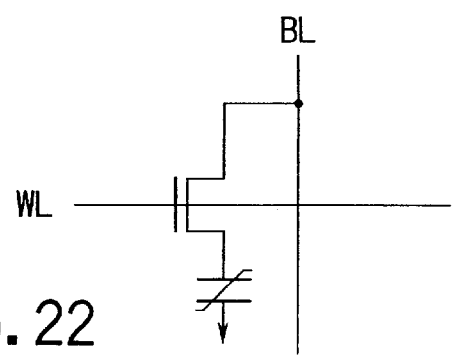
FIG. 22, which shows an example of a memory cell to which the present invention is applied, is a circuit diagram of a ferroelectric DRAM.

Although the case where the present invention has been applied to a NOR flash EEPROM has been explained, the invention is not restricted to this. The invention may be applied to a dynamic DRAM shown in FIG. 20, a static RAM shown in FIG. 21, or a ferroelectric random access memory (FRAM) shown in FIG. 22.

While in FIGS. 16 and 18, the power source Vcc is supplied to the differential amplifiers OP1, OP2, the power source VPP2 may be supplied to the differential amplifiers OP1, OP2 as in FIG. 13.

Furthermore, a suitable combination of the configurations described in the first to fourth embodiments may be used.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A voltage generating circuit comprising:
    an output node for outputting at least two types of output potentials;
    a voltage divider circuit which is connected to said output node, divides the output potential at said output node, and outputs the divided voltage;
    a first differential amplifier to which a reference voltage and said divided voltage outputted from said voltage divider circuit are supplied and which outputs a first output signal according to the potential difference between said divided voltage and said reference voltage;
    a second differential amplifier to which said reference voltage and said divided voltage outputted from said voltage divider circuit are supplied and which outputs a second output signal according to the potential difference between said divided voltage and said reference voltage;
    a charging circuit which is connected between a first power source and said output node and which charges said output node according to the output signal of said first differential amplifier; and
    a discharging circuit which is connected between a second power source and said output node and which discharges said output node according to the output signal of said second differential amplifier, wherein
    said voltage divider circuit includes
        a first resistance circuit one end of which is connected to said output node and whose resistance value is varied according to a first control signal, and
        a second resistance circuit which is connected to the other end of said first resistance circuit and which changes the value of the current flowing through said first resistance circuit according to a second control signal.

2. The circuit according to claim 1, wherein said first resistance circuit comprises
    a first resistance group including first resistances, said first resistances differing in resistance value, and one end of each of said first resistances being connected in common to a first node, and
    a first switch circuit including first switches, one end of the current path of each of said first switches being connected to said output node, the other end of the current path of each of said first switches being connected to the other end of each of said first resistances, and one of said first switches being caused to conduct according to the first control signal, thereby selecting one of said first resistances.

3. The circuit according to claim 2, wherein said second resistance circuit comprises
    a second resistance group including second resistances connected in series,
    a third resistance group including third resistances, one end of each of said third resistances being connected to the corresponding node of said second resistances,
    a second switch circuit which includes second switches, one end of the current path of each of said second switches being connected in common to said first node, the other end of the current path of each of said second switches being connected to the other end of each of said third resistances, and said second switches being turned on and off according to said second control signal,
    a current source circuit which is connected to a second node and supplies current to said second node, and
    a third switch circuit which includes third switches, one end of the current path of each of said third switches being connected in common to said second node, the other end of the current path of each of said third switches being connected to the other end of each of said third resistances, and said third switches being turned on and off according to said second control signal.

4. The circuit according to claim 3, wherein said current source circuit keeps said second node at a constant potential.

5. The circuit according to claim 4, further comprising:
    a fourth switch circuit including fourth switches, one end of the current path of each of said fourth switches being connected to specific junction nodes in said second resistance group; and
    a fourth resistance group including fourth resistances, one end of each of said fourth resistances being connected to the other end of the current path of each of said fourth switches, the other end of each of said fourth resistances being connected to said second power source, and each of said fourth switches being turned on and off by said first control signal.

6. The circuit according to claim 3, wherein each of said third resistances has twice the value of each of said second resistances.

7. The circuit according to claim 1, further comprising a first power supply circuit which is connected to said charging circuit and generates said first power source with a first voltage by stepping up an external supply voltage.

8. The circuit according to claim 7, further comprising a second power supply circuit which is connected to said first and second differential amplifiers and generates a third voltage higher than said second voltage by stepping up the external supply voltage.

9. The circuit according to claim 8, wherein said first and second differential amplifiers comprise
- a first and a second transistor of a first conductivity type each having a current path and a gate, said third voltage being supplied to one end of each of said current paths of the first and second transistors, and said gates being connected in common,
- a third transistor of the first conductivity type having a current path and a gate, one end of said current path of the third transistor being connected to the other end of the current path of said first transistor,
- a fourth transistor of a second conductivity type having a current path and a gate, one end of said current path of the fourth transistor being connected to the other end of the current path and gate of said second transistor, and
- a fifth transistor of the second conductivity type having a current path and a gate, one end of said current path of the fifth transistor being connected to the other ends of the current paths of said third and fourth transistors, the other end of said current path of said fifth transistor being connected to said second power source, and the said gate of said fifth transistor being connected to the gates of said first and second transistors.

10. A voltage generating circuit comprising:
- an output node for outputting at least two types of output potentials;
- a voltage divider circuit which is connected to said output node, divides the output potential at said output node, and outputs a first divided voltage and a second divided voltage;
- a first differential amplifier to which a reference voltage and said first divided voltage outputted from said voltage divider circuit are supplied and which outputs a first output signal according to the potential difference between said first divided voltage and said reference voltage;
- a second differential amplifier to which said reference voltage and said second divided voltage outputted from said voltage divider circuit are supplied and which outputs a second output signal according to the potential difference between said second divided voltage and said reference voltage;
- a charging circuit which is connected between a first power source and said output node and which charges said output node according to the output signal of said first differential amplifier; and
- a discharging circuit which is connected between a second power source and said output node and which discharges said output node according to the output signal of said second differential amplifier, wherein said voltage divider circuit includes
    - a first resistance circuit one end of which is connected to said output node and whose resistance value is varied according to a first control signal,
    - a second resistance circuit which changes the value of the current flowing through said first resistance circuit according to a second control signal, and
    - a voltage divider resistance which is connected between said first resistance circuit and said second resistance circuit and generates said first divided voltage and said second divided voltage.

11. The circuit according to claim 10, wherein said first resistance circuit comprises
- first resistance group including first resistances, said first resistances differing in resistance value, and one end of each of said first resistances being connected in common to one end of said voltage divider resistance, and
- a first switch circuit including first switches, one end of the current path of each of said first switches being connected to said output node, the other end of the current path of each of said first switches being connected to the other end of each of said first resistances, and one of said first switches being caused to conduct according to the first control signal, thereby selecting one of said first resistances.

12. The circuit according to claim 10, wherein said second resistance circuit comprises
- a second resistance group including second resistances connected in series,
- a third resistance group including third resistances, one end of each of said third resistances being connected to the corresponding node of said second resistances,
- a second switch circuit which includes second switches, one end of the current path of each of said second switches being connected to a first node serving as the other end of said voltage divider resistance, the other end of the current path of each of said second switches being connected to the other end of each of said third resistances, and said second switches being turned on and off according to said second control signal,
- a current source circuit which is connected to a second node and supplies current to said second node, and
- a third switch circuit which includes third switches, one end of the current path of each of said third switches being connected in common to said second node, the other end of the current path of each of said third switches being connected to the other end of each of said third resistances, and said third switches being turned on and off according to said second control signal.

13. The circuit according to claim 12, wherein said current source circuit keeps said second node at a constant potential.

14. The circuit according to claim 13, further comprising:
- a fourth switch circuit including fourth switches, one end of the current path of each of said fourth switches being connected to specific junction nodes in said second resistance group; and
- a fourth resistance group including fourth resistances, one end of each of said fourth resistances being connected to the other end of the current path of each of said fourth switches, the other end of each of said fourth resistances being connected to said second power source, and each of said fourth switches being turned on and off by said first control signal.

15. The circuit according to claim 12, wherein each of said third resistances has twice the value of each of said second resistances.

16. A voltage generating circuit comprising:
- an output node for outputting at least two types of output potentials;

a voltage divider circuit which is connected to said output node, divides the output potential at said output node, and outputs a divided voltage;

a first differential amplifier to which a first reference voltage and said divided voltage outputted from said voltage divider circuit are supplied and which outputs a first output signal according to the potential difference between said divided voltage and said first reference voltage;

a second differential amplifier to which a second reference voltage and said divided voltage outputted from said voltage divider circuit are supplied and which outputs a second output signal according to the potential difference between said divided voltage and said second reference voltage;

a charging circuit which is connected between a first power source and said output node and which charges said output node according to the output signal of said first differential amplifier; and a discharging circuit which is connected between a second power source and said output node and which discharges said output node according to the output signal of said second differential amplifier, wherein said voltage divider circuit includes a first resistance circuit one end of which is connected to said output node and whose resistance value is varied according to a first control signal, and a second resistance circuit which is connected to the other end of said first resistance circuit and which changes the value of the current flowing through said first resistance circuit according to a second control signal.

17. The circuit according to claim 16, wherein said first resistance circuit comprises a first resistance group including first resistances, said first resistances differing in resistance value, and one end of each of said first resistances being connected in common to a first node, and a first switch circuit including first switches, one end of the current path of each of said first switches being connected to said output node, the other end of the current path of each of said first switches being connected to the other end of each of said first resistances, and one of said first switches being caused to conduct according to the first control signal, thereby selecting one of said first resistances.

18. The circuit according to claim 17, wherein said second resistance circuit comprises a second resistance group including second resistances connected in series, a third resistance group including third resistances, one end of each of said third resistances being connected to the corresponding node of said second resistances, a second switch circuit which includes second switches, one end of the current path of each of said second switches being connected in common to said first node, the other end of the current path of each of said second switches being connected to the other end of each of said third resistances, and said second switches being turned on and off according to said second control signal, a current source circuit which is connected to a second node and supplies current to said second node, and a third switch circuit which includes third switches, one end of the current path of each of said third switches being connected in common to said second node, the other end of the current path of each of said third switches being connected to the other end of each of said third resistances, and said third switches being turned on and off according to said second control signal.

19. The circuit according to claim 18, wherein said current source circuit keeps said second node at a constant potential.

20. The circuit according to claim 18, wherein each of said third resistances has twice the value of each of said second resistances.

21. The circuit according to claim 19, further comprising:

a fourth switch circuit including fourth switches, one end of the current path of each of said fourth switches being connected to specific junction nodes in said second resistance group; and a fourth resistance group including fourth resistances, one end of each of said fourth resistances being connected to the other end of the current path of each of said fourth switches, the other end of each of said fourth resistances being connected to said second power source, and each of said fourth switches being turned on and off by said first control signal.

22. The circuit according to claim 16, further comprising a first power supply circuit which is connected to said charging circuit and generates said first power source with a first voltage by stepping up an external supply voltage.

23. The circuit according to claim 22, further comprising a second power supply circuit which is connected to said first and second differential amplifiers and generates a third voltage higher than said second voltage by stepping up the external supply voltage.

* * * * *